(12) United States Patent
Gu et al.

(10) Patent No.: US 12,367,833 B2
(45) Date of Patent: Jul. 22, 2025

(54) PIXEL CIRCUIT, DISPLAY SUBSTRATE, DISPLAY PANEL, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Pinchao Gu, Beijing (CN); Weiyun Huang, Beijing (CN); Yudiao Cheng, Beijing (CN); Chao Wu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/777,089

(22) Filed: Jul. 18, 2024

(65) Prior Publication Data

US 2024/0371325 A1 Nov. 7, 2024

Related U.S. Application Data

(63) Continuation of application No. 17/772,594, filed as application No. PCT/CN2021/094026 on May 17, 2021, now Pat. No. 12,073,788.

(30) Foreign Application Priority Data

Jun. 29, 2020 (CN) .......................... 202010606662.9

(51) Int. Cl.
*G09G 3/3233* (2016.01)
*G09G 3/3241* (2016.01)
(Continued)

(52) U.S. Cl.
CPC ......... *G09G 3/3233* (2013.01); *G09G 3/3241* (2013.01); *G09G 3/3291* (2013.01);
(Continued)

(58) Field of Classification Search
None
See application file for complete search history.

(56) References Cited

U.S. PATENT DOCUMENTS 9,349,321 B2 5/2016 Chen
10,622,424 B2 4/2020 Lin et al.
(Continued)

FOREIGN PATENT DOCUMENTS

CN 104021763 A 9/2014
CN 108877649 A 11/2018
(Continued)

OTHER PUBLICATIONS

European Search Report issued by European Patent Office corresponding to European Application No. EP21831733.7 Dated Jan. 10, 2023.
(Continued)

*Primary Examiner* — Andre L Matthews
(74) *Attorney, Agent, or Firm* — LEASON ELLIS LLP

(57) ABSTRACT

A pixel circuit, a display substrate, a display panel, and a display device are provided. The pixel circuit includes: a first driving circuit, a second driving circuit, a first light-emitting control circuit, and a second light-emitting control circuit. The first light-emitting control circuit is configured to control a connection between the first driving circuit and the light-emitting element and a connection between the first driving circuit and the first power line to be turned on or off; the second light-emitting control circuit is configured to control a connection between the second driving circuit and the light-emitting element and a connection between the
(Continued)

second driving circuit and the second power line to be turned on or off; the first driving circuit and the second driving circuit are configured to control a driving current for driving the light-emitting element to emit light based on the same data voltage.

20 Claims, 16 Drawing Sheets

(51) Int. Cl.
  *G09G 3/3291* (2016.01)
  *H10K 59/131* (2023.01)
  *H10K 59/65* (2023.01)
(52) U.S. Cl.
  CPC ............... *G09G 2300/0426* (2013.01); *G09G 2320/0233* (2013.01); *G09G 2330/028* (2013.01); *H10K 59/131* (2023.02); *H10K 59/65* (2023.02)

(56) References Cited

U.S. PATENT DOCUMENTS

| | | | |
|---|---|---|---|
| 11,011,112 B2 | 5/2021 | Li et al. | |
| 11,107,414 B2 | 8/2021 | Feng et al. | |
| 2004/0056252 A1 | 3/2004 | Kasai | |
| 2015/0043125 A1 | 2/2015 | Park | |
| 2017/0243542 A1 | 8/2017 | Xiang et al. | |
| 2019/0130836 A1 | 5/2019 | Liu et al. | |
| 2019/0213944 A1 | 7/2019 | Zhou | |
| 2021/0358401 A1 | 11/2021 | Liu | |
| 2022/0123094 A1 | 4/2022 | Qiu et al. | |
| 2022/0384548 A1 | 12/2022 | Keum | |

FOREIGN PATENT DOCUMENTS

| | | |
|---|---|---|
| CN | 109166529 A | 1/2019 |
| CN | 110189706 A | 8/2019 |
| CN | 110299107 A | 10/2019 |
| CN | 110473494 A | 11/2019 |
| CN | 110491338 A | 11/2019 |
| CN | 110767160 A | 2/2020 |
| CN | 111210762 A | 5/2020 |
| CN | 111326560 A | 6/2020 |

OTHER PUBLICATIONS

First Chinese Office Action issued by Chinese Patent Office IN corresponding Chinese Application No. 20201606662.9 dated Jun. 2, 2022.

PIXEL CIRCUIT, DISPLAY SUBSTRATE, DISPLAY PANEL, AND DISPLAY DEVICE

CROSS-REFERENCE TO RELATED APPLICATION

This application is a continuation of U.S. patent application Ser. No. 17/772,594 filed on Apr. 28, 2022, which is a U.S. National Stage Application under 35 U.S.C. § 371 of International Patent Application No. PCT/CN2021/094026 filed on May 17, 2021, which claims the benefit of priority of Chinese Patent Application number 202010606662.9 filed on Jun. 29, 2020. All the aforementioned patent applications are hereby incorporated by reference in their entireties.

TECHNICAL FIELD

The embodiments of the present disclosure relate to a pixel circuit, a display substrate, a display panel, and a display device.

BACKGROUND

With the in-depth development of full-screen display, it has developed from a scheme of placing a camera in an opening region of a display panel to a scheme of combining the camera with the display panel, that is, the scheme of "under-screen camera". For the display design of "under-screen camera", a region, where the camera is placed, of the display panel is a low PPI (Pixels Per Inch) region, so that the transmittance of the low PPI region can meet the requirements of camera imaging. However, because the PPI of the pixel arrangement in the low PPI region is lower than the PPI of a normal display region, the display brightness of the low PPI region is lower than the display brightness of the normal display region.

SUMMARY

At least one embodiment of the present disclosure provides a pixel circuit, comprising: a first driving circuit, a second driving circuit, a first light-emitting control circuit, a second light-emitting control circuit, a storage circuit, and a data writing circuit. The first light-emitting control circuit is electrically connected to a first power line, the first driving circuit, and a light-emitting element, and is configured to control a connection between the first driving circuit and the light-emitting element to be turned on or off and to control a connection between the first driving circuit and the first power line to be turned on or off; the second light-emitting control circuit is electrically connected to a second power line, the second driving circuit, and the light-emitting element, and is configured to control a connection between the second driving circuit and the light-emitting element to be turned on or off and to control a connection between the second driving circuit and the second power line to be turned on or off; the data writing circuit is electrically connected to the first driving circuit, and is configured to write a data voltage into the first driving circuit; the first driving circuit and the second driving circuit are configured to control a driving current for driving the light-emitting element to emit light based on a same data voltage; and the storage circuit is electrically connected to a control terminal of the first driving circuit and a control terminal of the second driving circuit, and is configured to maintain a voltage of the control terminal of the first driving circuit and a voltage of the control terminal of the second driving circuit.

For example, the pixel circuit provided by at least one embodiment of the present disclosure further includes a power connection line, the first power line and the second power line are electrically connected to each other through the power connection line.

For example, in the pixel circuit provided by at least one embodiment of the present disclosure, the pixel circuit is on a base substrate, the pixel circuit has a first functional layer and a second functional layer, the first functional layer and the second functional layer are on the base substrate, and the first functional layer is on a side of the second functional layer away from the base substrate in a direction perpendicular to the base substrate; the first power line and the second power line are in the first functional layer; the power connection line is in the second functional layer; and the power connection line is electrically connected to the first power line and the second power line through holes.

For example, in the pixel circuit provided by at least one embodiment of the present disclosure, the control terminal of the first driving circuit and the control terminal of the second driving circuit are electrically connected.

For example, the pixel circuit provided by at least one embodiment of the present disclosure further comprises a first gate connection line, a second gate connection line, and a third gate connection line; the control terminal of the first driving circuit and the control terminal of the second driving circuit are electrically connected through the first gate connection line, the second gate connection line, and the third gate connection line; the control terminal of the first driving circuit is electrically connected to the first gate connection line, and the control terminal of the second driving circuit is electrically connected to the second gate connection line; and the third gate connection line is used to electrically connect the first gate connection line and the second gate connection line to electrically connect the control terminal of the first driving circuit to the control terminal of the second driving circuit.

For example, in the pixel circuit provided by at least one embodiment of the present disclosure, the pixel circuit is on a base substrate, the pixel circuit has a first functional layer and a second functional layer, the first functional layer and the second functional layer are on the base substrate, and the first functional layer is on a side of the second functional layer away from the base substrate in a direction perpendicular to the base substrate; the first gate connection line and the second gate connection line are in the first functional layer; the third gate connection line is in the second functional layer; and the third gate connection line is connected to the first gate connection line and the second gate connection line through holes.

For example, in the pixel circuit provided by at least one embodiment of the present disclosure, the first driving circuit comprises a first driving transistor, and the second driving circuit comprises a second driving transistor, the control terminal of the first driving circuit comprises a gate electrode of the first driving transistor, the control terminal of the second driving circuit comprises a gate electrode of the second driving transistor, a threshold voltage of the first driving transistor is identical to a threshold voltage of the second driving transistor.

For example, the pixel circuit provided by at least one embodiment of the present disclosure further comprises a threshold compensation circuit, the threshold compensation circuit is electrically connected to the control terminal of the first driving circuit and the control terminal of the second driving circuit, and is configured to perform threshold compensation on the first driving circuit.

For example, the pixel circuit provided by at least one embodiment of the present disclosure further comprising a first initialization circuit and a second initialization circuit, the first initialization circuit is electrically connected to the control terminal of the first driving circuit and the control terminal of the second driving circuit, and is configured to initialize the control terminal of the first driving circuit and the control terminal of the second driving circuit; and the second initialization circuit is electrically connected to a first electrode of the light-emitting element and is configured to initialize the first electrode of the light-emitting element.

For example, in the pixel circuit provided by at least one embodiment of the present disclosure, the first light-emitting control circuit comprises a first light-emitting control sub-circuit and a second light-emitting control sub-circuit; the first light-emitting control sub-circuit is connected to a first terminal of the first driving circuit and the first power line, and is configured to turn on or off a connection between the first terminal of the first driving circuit and the first power line; and the second light-emitting control sub-circuit is electrically connected to a second terminal of the first driving circuit and a first electrode of the light-emitting element, and is configured to turn on or off a connection between the second terminal of the first driving circuit and the first electrode of the light-emitting element.

For example, in the pixel circuit provided by at least one embodiment of the present disclosure, the second light-emitting control circuit comprises a third light-emitting control sub-circuit and a fourth light-emitting control sub-circuit, the third light-emitting control sub-circuit is connected to a first terminal of the second driving circuit and the second power line, and is configured to turn on or off a connection between the first terminal of the second driving circuit and the second power line, the fourth light-emitting control sub-circuit is electrically connected to a second terminal of the second driving circuit and a first electrode of the light-emitting element, and is configured to turn on or off a connection between the second terminal of the second driving circuit and the first electrode of the light-emitting element.

For example, the pixel circuit provided by at least one embodiment of the present disclosure further comprising a threshold compensation circuit, a first initialization circuit, and a second initialization circuit, the first light-emitting control circuit comprises a first light-emitting control sub-circuit and a second light-emitting control sub-circuit, and the second light-emitting control circuit comprises a third light-emitting control sub-circuit and a fourth light-emitting control sub-circuit; the first driving circuit comprises a first driving transistor, the second driving circuit comprises a second driving transistor, the first light-emitting control sub-circuit comprises a first light-emitting control transistor, the second light-emitting control sub-circuit comprises a second light-emitting control transistor, the third light-emitting control sub-circuit comprises a third light-emitting control transistor, the fourth light-emitting control sub-circuit comprises a fourth light-emitting control transistor, the data writing circuit comprises a data writing transistor, the storage circuit comprises a storage capacitor, the threshold compensation circuit comprises a threshold compensation transistor, the first initialization circuit comprises a first initialization transistor, and the second initialization circuit comprises a second initialization transistor; the control terminal of the first driving circuit comprises a gate electrode of the first driving transistor, the control terminal of the second driving circuit comprises a gate electrode of the second driving transistor; a first electrode of the data writing transistor is electrically connected to a data line to receive the data voltage, a second electrode of the data writing transistor is electrically connected to a first electrode of the first driving transistor, and a gate electrode of the data writing transistor is electrically connected to a first scan line; a first electrode of the first light-emitting control transistor is electrically connected to the first power line, a second electrode of the first light-emitting control transistor is electrically connected to the first electrode of the first driving transistor, and a gate electrode of the first light-emitting control transistor is electrically connected to a first light-emitting control signal line; a first electrode of the second light-emitting control transistor is electrically connected to a second electrode of the first driving transistor, a second electrode of the second light-emitting control transistor is electrically connected to a first electrode of the light-emitting element, and a gate electrode of the second light-emitting control transistor is electrically connected to a second light-emitting control signal line; a first electrode of the third light-emitting control transistor is electrically connected to the second power line, a second electrode of the third light-emitting control transistor is electrically connected to a first electrode of the second driving transistor, and a gate electrode of the third light-emitting control transistor is electrically connected to a third light-emitting control signal line; a first electrode of the fourth light-emitting control transistor is electrically connected to a second electrode of the second driving transistor, a second electrode of the fourth light-emitting control transistor is electrically connected to the first electrode of the light-emitting element, and a gate electrode of the fourth light-emitting control transistor is electrically connected to a fourth light-emitting control signal line; a first electrode of the threshold compensation transistor is electrically connected to the second electrode of the first driving transistor, a second electrode of the threshold compensation transistor is electrically connected to the gate electrode of the first driving transistor and the gate electrode of the second driving transistor, and a gate electrode of the threshold compensation transistor is electrically connected to a second scan line; a first electrode of the first initialization transistor is electrically connected to a first initialization voltage line, a second electrode of the first initialization transistor is electrically connected to the gate electrode of the first driving transistor and the gate electrode of the second driving transistor, and a gate electrode of the first initialization transistor is electrically connected to a first initialization control signal line; a first electrode of the second initialization transistor is electrically connected to a second initialization voltage line, a second electrode of the second initialization transistor is electrically connected to the first electrode of the light-emitting element, and a gate electrode of the second initialization transistor is electrically connected to a second initialization control signal line; and a first electrode of the storage capacitor is electrically connected to the gate electrode of the first driving transistor and the gate electrode of the second driving transistor, and a second electrode of the storage capacitor is electrically connected to the first power line.

For example, in the pixel circuit provided by at least one embodiment of the present disclosure, the pixel circuit is on a base substrate, the pixel circuit has a first functional layer, a second functional layer, and a third functional layer, the first functional layer, the second functional layer, and the third functional layer are on the base substrate, and in a direction perpendicular to the base substrate, the second functional layer is between the first functional layer and the third functional layer, the second functional layer is on a side of the third functional layer away from the base substrate, the first functional layer is on a side of the second functional layer away from the base substrate, the first scan line, the second scan line, the first light-emitting control signal line, the second light-emitting control signal line, the third light-emitting control signal line, and the fourth light-emitting control signal line are in the third functional layer; the data line, the first power line, and the second power line are in the first functional layer; and the first initialization voltage line and the second initialization voltage line are in the second functional layer.

For example, in the pixel circuit provided by at least one embodiment of the present disclosure, the first driving transistor and the second driving transistor transmit the driving current to the light-emitting element to drive the light-emitting element to emit light in a light-emitting phase, the driving current is expressed as:

$$I_{OLED} = K1*(Vgs1 - Vth1) + K2*(Vgs2 - Vth2),$$

where $I_{OLED}$ represents the driving current, K1 is a process constant of the first driving transistor, Vgs1 is a voltage difference between the gate electrode and the first electrode of the first driving transistor in the light-emitting phase, Vth1 is a threshold voltage of the first driving transistor, K2 is a process constant of the second driving transistor, Vgs2 is a voltage difference between the gate electrode and the first electrode of the second driving transistor in the light-emitting stage, and Vth2 is a threshold voltage of the second driving transistor.

At least one embodiment of the present disclosure provides a display substrate, the display substrate comprises a plurality of sub-pixels, and each of the plurality of sub-pixels comprises the pixel circuit and the light-emitting element according to any one of the embodiments of the present disclosure.

For example, the display substrate provided by at least one embodiment of the present disclosure further comprises a base substrate, the base substrate comprises a first display region, the first display region comprises a plurality of pixel regions, each pixel region of the plurality of pixel regions comprises a first sub-region and a second sub-region that do not overlap each other, the first driving circuit, the first light-emitting control circuit, the storage circuit, and the data writing circuit in the pixel circuit are in a first sub-region of a corresponding pixel region, the second driving circuit and the second light-emitting control circuit in the pixel circuit are in a second sub-region of the corresponding pixel region.

For example, in the display substrate provided by at least one embodiment of the present disclosure, the base substrate further comprises a second display region; the plurality of sub-pixels comprise a plurality of first sub-pixels and a plurality of second sub-pixels, and pixel circuits of the plurality of first sub-pixels and pixel circuits of the plurality of second sub-pixels are in one-to-one correspondence with the plurality of pixel regions; the second display region at least partially surrounds the first display region, the display substrate has a first side for display and a second side opposite to the first side, and the first display region allows light from the first side to be at least partially transmitted to the second side; light-emitting elements of the plurality of first sub-pixels are in the first display region, and the pixel circuits of the plurality of first sub-pixels are in the second display region; and light-emitting elements and the pixel circuits of the plurality of second sub-pixels are in the second display region.

For example, in the display substrate provided by at least one embodiment of the present disclosure, the first sub-region of each pixel region comprises a first side and a second side opposite to each other, the pixel circuits of the plurality of first sub-pixels constitute a plurality of first repeating units, each first repeating unit comprises pixel circuits of four first sub-pixels arranged in two rows and two columns, a second sub-region in a pixel region corresponding to a pixel circuit, among the pixel circuits of the four first sub-pixels, of a first sub-pixel located in a first row and a first column is on a first side of a first sub-region in the pixel region corresponding to the pixel circuit of the first sub-pixel located in the first row and the first column, a second sub-region in a pixel region corresponding to a pixel circuit, among the pixel circuits of the four first sub-pixels, of a first sub-pixel located in a second row and the first column is on a first side of a first sub-region in the pixel region corresponding to the pixel circuit of the first sub-pixel located in the second row and the first column, a second sub-region in a pixel region corresponding to a pixel circuit, among the pixel circuits of the four first sub-pixels, of a first sub-pixel located in the first row and a second column is on a second side of a first sub-region in the pixel region corresponding to the pixel circuit of the first sub-pixel located in the first row and the second column, a second sub-region in a pixel region corresponding to a pixel circuit, among the pixel circuits of the four first sub-pixels, of a first sub-pixel located in the second row and the second column is on a second side of a first sub-region in the pixel region corresponding to the pixel circuit of the first sub-pixel located in the second row and the second column, the pixel circuits of the plurality of second sub-pixels constitute a plurality of second repeating units, each second repeating unit comprises pixel circuits of four second sub-pixels arranged in two rows and two columns, a second sub-region in a pixel region corresponding to a pixel circuit, among the pixel circuits of the four second sub-pixels, of a second sub-pixel located in a first row and a first column is on a second side of a first sub-region in the pixel region corresponding to the pixel circuit of the second sub-pixel located in the first row and the first column, a second sub-region in a pixel region corresponding to a pixel circuit, among the pixel circuits of the four second sub-pixels, of a second sub-pixel located in a second row and the first column is on a second side of a first sub-region in the pixel region corresponding to the pixel circuit of the second sub-pixel located in the second row and the first column, a second sub-region in a pixel region corresponding to a pixel circuit, among the pixel circuits of the four second sub-pixels, of a second sub-pixel located in the first row and a second column is on a first side of a first sub-region in the pixel region corresponding to the pixel circuit of the second sub-pixel located in the first row and the second column, and a second sub-region in a pixel region corresponding to a pixel circuit, among the pixel circuits of the four second sub-pixels, of a second sub-pixel located in the second row and the second column is on a first side of a first sub-region in the pixel region corresponding to the pixel circuit of the second sub-pixel located in the second row and the second column.

For example, in the display substrate provided by at least one embodiment of the present disclosure, the plurality of first repeating units and the plurality of second repeating units constitute a plurality of repeating unit groups, and each repeating unit group in the plurality of repeating unit groups comprises two first repeating units and two second repeating units, the two first repeating units and the two second repeating units are arranged in two rows and two columns, the two first repeating units are respectively in a first row and a second column, and a second row and a first column, and the two second repeating units are respectively in the first row and the first column, and the second row and the second column; or, the two first repeating units are respectively in a first row and a first column, and a second row and a second column, and the two second repeating units are respectively in the first row and the second column, and the second row and the first column.

For example, in the display substrate provided by at least one embodiment of the present disclosure, the first sub-pixel located in the first row and the first column among the four first sub-pixels and the second sub-pixel located in the first row and the first column among the four second sub-pixels are red sub-pixels, the first sub-pixel located in the second row and the first column among the four first sub-pixels and the second sub-pixel located in the second row and the first column among the four second sub-pixels are blue sub-pixels, the first sub-pixel located in the first row and the second column among the four first sub-pixels, the first sub-pixel located in the second row and the second column among the four first sub-pixels, the second sub-pixel located in the first row and the second column among the four second sub-pixels, and the second sub-pixel located in the second row and the second column among the four second sub-pixels are green sub-pixels.

At least one embodiment of the present disclosure provides a display panel, comprising the display substrate according to any embodiment of the present disclosure.

At least one embodiment of the present disclosure provides a display device, comprising the display panel according to any embodiment of the present disclosure.

BRIEF DESCRIPTION OF THE DRAWINGS

In order to more clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

Figure 1A:
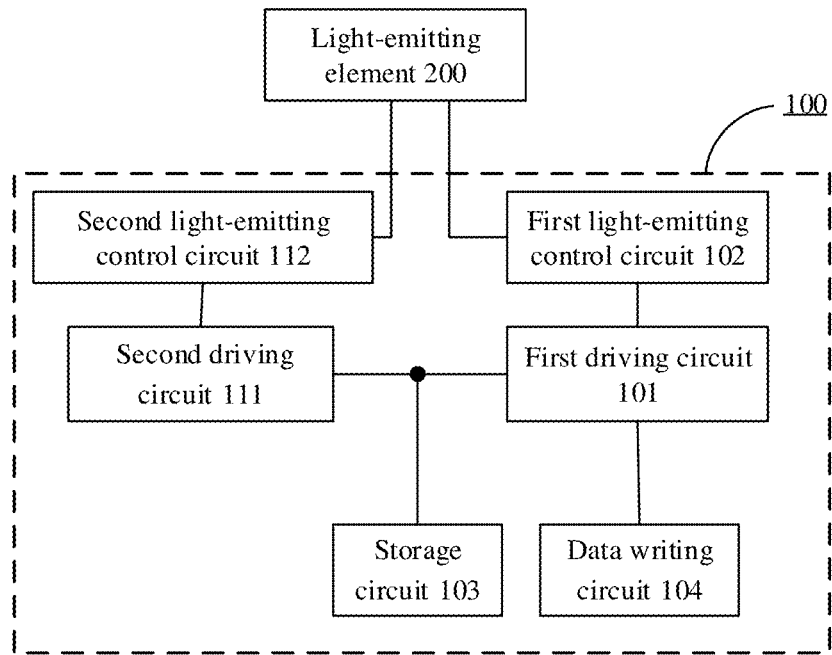
FIG. 1A is a schematic block diagram of a pixel circuit provided by an embodiment of the present disclosure.

In order to make objects, technical solutions, and advantages of the embodiments of the present disclosure more apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used in the present disclosure have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the absolute position of the object which is described is changed, the relative position relationship may be changed accordingly.

In order to keep the following description of the embodiments of the present disclosure clear and concise, the present disclosure omits detailed descriptions of some known functions and components.

In the design scheme of "under-screen camera", in order to allow more light to enter the camera located below the display panel, the display panel can be designed to have a high pixel density region (i.e., a high PPI region) and a low pixel density region (i.e., a low PPI region), and the camera is arranged below the low pixel density region that can allow more light to pass through. However, because a distribution density per unit area of light-emitting elements in the low pixel density region is lower than a distribution density per unit area of light-emitting elements in the high pixel density region, as a result, the luminous brightness of the low pixel density region is lower than the luminous brightness of the high pixel density region, which affects the display effect of the display panel and reduces the display quality of the display panel.

At least one embodiment of the present disclosure provides a pixel circuit, a display substrate, a display panel, and a display device. The pixel circuit includes a first driving circuit, a second driving circuit, a first light-emitting control circuit, a second light-emitting control circuit, a storage circuit, and a data writing circuit. The first light-emitting control circuit is electrically connected to a first power line, the first driving circuit, and a light-emitting element, and is configured to control a connection between the first driving circuit and the light-emitting element to be turned on or off and to control a connection between the first driving circuit and the first power line to be turned on or off; the second light-emitting control circuit is electrically connected to a second power line, the second driving circuit, and the light-emitting element, and is configured to control a connection between the second driving circuit and the light-emitting element to be turned on or off and to control a connection between the second driving circuit and the second power line to be turned on or off; the data writing circuit is electrically connected to the first driving circuit, and is configured to write a data voltage into the first driving circuit; the first driving circuit and the second driving circuit are configured to control a driving current for driving the light-emitting element to emit light based on a same data voltage; the storage circuit is electrically connected to a control terminal of the first driving circuit and a control terminal of the second driving circuit, and is configured to maintain a voltage of the control terminal of the first driving circuit and a voltage of the control terminal of the second driving circuit.

In the pixel circuit, by adding the second driving circuit which drives the light-emitting element in the low pixel density region to emit light, two driving circuits can simultaneously drive one light-emitting element, thereby increasing the driving current for driving the light-emitting element in the low pixel density region, increasing the brightness of the low pixel density region, reducing or eliminating the problem of uneven luminous brightness caused by setting the camera under the display panel, and improving the display effect and the display quality.

For example, according to the characteristics of transistors, the transistors can be divided into N-type transistors and P-type transistors. For the sake of clarity, the embodiments of the present disclosure illustrate the technical solution of the present disclosure in detail by taking a case that the transistors are P-type transistors (for example, low temperature polysilicon (LTPS) P-type thin film transistors) as an example. However, the transistors of the embodiment of the present disclosure are not limited to P-type transistors, and those skilled in the art can also use N-type transistors (for example, N-type MOS transistors) to implement the functions of one or more transistors in the embodiments of the present disclosure according to actual needs.

It should be noted that the transistors used in the embodiments of the present disclosure can be thin film transistors, field effect transistors, or other switching devices with the same characteristics, and the thin film transistors can include oxide semiconductor thin film transistors, amorphous silicon thin film transistors, or polysilicon thin film transistors, etc., A source electrode and a drain electrode of the transistor can be symmetrical in structure, so the source electrode and the drain electrode of the transistor can be indistinguishable in physical structure. In the embodiments of the present disclosure, in order to distinguish the transistors, except a gate electrode as a control electrode, one of the source electrode and the drain electrode is directly described as a first electrode and the other is directly described as a second electrode, so the first electrode and the second electrode of all or part of the transistors in the embodiments of the present disclosure can be interchanged as needed.

Some embodiments of the present disclosure will be described in detail below, but the present disclosure is not limited to these specific embodiments.

Figure 1B:
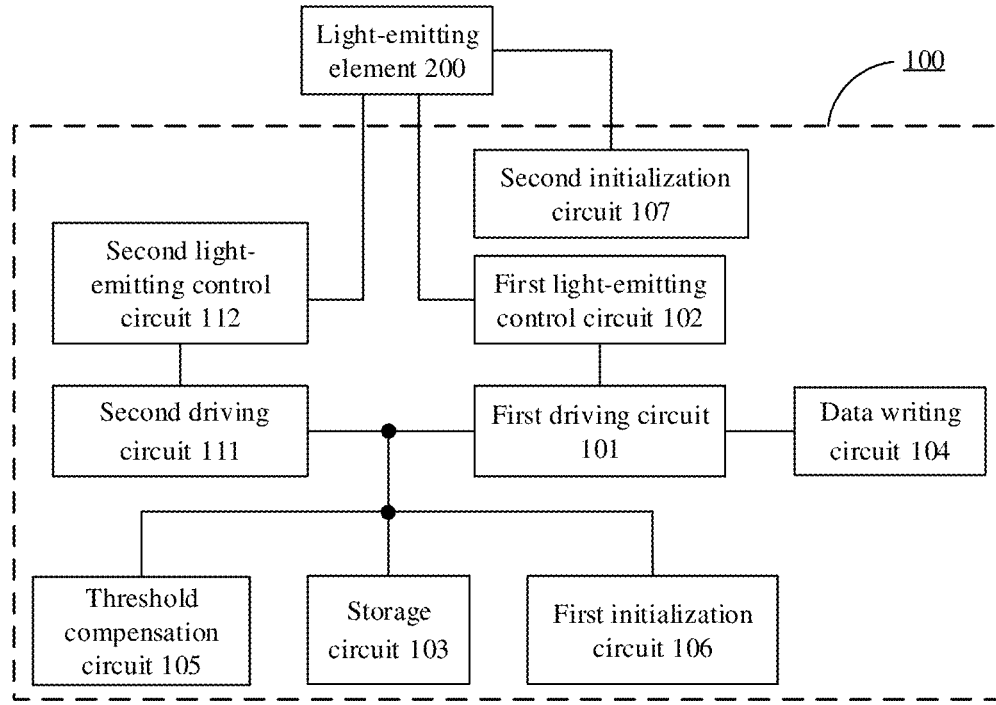
FIG. 1B is a schematic block diagram of another pixel circuit provided by an embodiment of the present disclosure.

FIG. 1A is a schematic block diagram of a pixel circuit provided by an embodiment of the present disclosure, and FIG. 1B is a schematic block diagram of another pixel circuit provided by an embodiment of the present disclosure.

For example, as shown in FIG. 1A, the pixel circuit 100 provided by the embodiment of the present disclosure may include a first driving circuit 101, a second driving circuit 111, a first light-emitting control circuit 102, a second light-emitting control circuit 112, a storage circuit 103, and a data writing circuit 104.

For example, the data writing circuit 104 is electrically connected to the first driving circuit 101, and is configured to write a data voltage into the first driving circuit 101. For example, the data writing circuit 104 is electrically connected to a first terminal of the first driving circuit 101, a data line, and a first scan line to write a data voltage provided by the data line into the first terminal of the first driving circuit 101 under the control of a first scan signal provided by the first scan line. For example, the data writing circuit 104 can also write the data voltage into the second driving circuit 111.

For example, the first driving circuit 101 and the second driving circuit 111 are configured to drive the light-emitting element 200 to emit light based on the same data voltage, so that the light-emitting element 200 emits light corresponding to the same data voltage.

For example, in some embodiments, a control terminal of the first driving circuit 101 and a control terminal of the second driving circuit 111 are electrically connected, so that the first driving circuit 101 and the second driving circuit 111 can be controlled by the same signal, in this case, the first driving circuit 101 and the second driving circuit 111 can share the same data writing circuit 104, the same storage circuit 103, the same threshold compensation circuit (described below), and the same first initialization circuit (described below), thereby reducing the number of transistors and capacitors in the pixel circuit and saving the cost. However, the present disclosure is not limited to this case, in other embodiments, the control terminal of the first driving circuit 101 and the control terminal of the second driving circuit 111 are not connected, but in this case, the control terminal of the first driving circuit 101 and the control terminal of the second driving circuit 111 can receive the same signal.

For example, the first light-emitting control circuit 102 is electrically connected to a first power line (not shown in FIG. 1A), the first driving circuit 101, and the light-emitting element 200, and is configured to control a connection between the first driving circuit 101 and the light-emitting element 200 to be turned on or off and a connection between the first driving circuit 101 and the first power line to be turned on or off. For example, the first light-emitting control circuit 102 is electrically connected to the first terminal and a second terminal of the first driving circuit 101, a first electrode of the light-emitting element 200, a first light-emitting control signal line, and a second light-emitting control signal line. The first light-emitting control circuit 102 is configured to control whether the first driving circuit 101 drives the light-emitting element 200 to emit light under the control of a first light-emitting control signal provided by the first light-emitting control signal line and a second light-emitting control signal provided by the second light-emitting control signal line. For example, when the first light-emitting control circuit 102 controls the connection between the first driving circuit 101 and the light-emitting element 200 and the connection between the first driving circuit 101 and the first power line to be turned on, the first driving circuit 101 drives the light-emitting element 200 to emit light at this time. When the first light-emitting control circuit 102 controls the connection between the first driving circuit 101 and the light-emitting element 200 and/or the connection between the first driving circuit 101 and the first power line to be turned off, at this time, the first driving circuit 101 does not drive the light-emitting element 200 to emit light.

For example, the second light-emitting control circuit 112 is electrically connected to a second power line (not shown in FIG. 1A), the second driving circuit 111, and the light-emitting element 200, and is configured to control a connection between the second driving circuit 111 and the light-emitting element 200 to be turned on or off and a connection between the second driving circuit 111 and the second power line to be turned on or off. For example, the second light-emitting control circuit 112 is electrically connected to the first terminal and a second terminal of the second driving circuit 111, the first electrode of the light-emitting element 200, a third light-emitting control signal line, and a fourth light-emitting control signal line. The second light-emitting control circuit 112 is configured to control whether the second driving circuit 111 drives the light-emitting element 200 to emit light under the control of a third light-emitting control signal provided by the third light-emitting control signal line and a fourth light-emitting control signal provided by the fourth light-emitting control signal line. For example, when the second light-emitting control circuit 112 controls the connection between the second driving circuit 111 and the light-emitting element 200 and the connection between the second driving circuit 111 and the second power line to be turned on, the second driving circuit 111 drives the light-emitting element 200 to emit light at this time. When the second light-emitting control circuit 112 controls the connection between the second driving circuit 111 and the light-emitting element 200 and/or the connection between the second driving circuit 111 and the second power line to be turned off, the second driving circuit 111 does not drive the light-emitting element 200 to emit light at this time.

For example, in some embodiments, the first power line and the second power line are electrically connected to each other; in other embodiments, the first power line and the second power line are not electrically connected to each other, however, a power voltage provided by the first power line is the same as a power voltage provided by the second power line. For example, the first power line and the second power line can be connected to the same power terminal to receive the same power voltage, so as to save the number of power terminals and the production cost.

For example, the storage circuit 103 is electrically connected to the control terminal of the first driving circuit 101 and the control terminal of the second driving circuit 111, and is configured to hold the voltage of the control terminal of the first driving circuit 101 and the voltage of the control terminal of the second driving circuit 11.

For example, a second electrode of the light-emitting element 200 is electrically connected to a third power line (not shown in FIG. 1A).

For example, both the first power line and the second power line provide a constant high power voltage, and the third power line may provide a constant low power voltage, or may be grounded, etc., However, the present disclosure is not limited to this case. In other embodiments, both the first power line and the second power line provide a constant low power voltage, and the third power line can provide a constant high power voltage.

For example, the light-emitting element 200 may be a light-emitting diode or the like. The light-emitting diode can be an organic light-emitting diode (OLED) or a quantum dot light-emitting diode (QLED), etc., The light-emitting element 200 is configured to receive a light-emitting signal (for example, it may be a current signal) and emit light with an intensity corresponding to the light-emitting signal during operation.

For example, the pixel circuit 100 provided by the embodiments of the present disclosure can be applied to a display panel, such as an active matrix organic light-emitting diode (AMOLED) display panel, an active matrix quantum dot light-emitting diode (AMQLED) display panel, or the like.

For example, as shown in FIG. 1B, in some embodiments, the pixel circuit 100 further includes a threshold compensation circuit 105. The threshold compensation circuit 105 is electrically connected to the control terminal of the first driving circuit 101 and the control terminal of the second driving circuit 102, and is configured to perform threshold compensation on the first driving circuit 101. For example, the threshold compensation circuit 105 is electrically connected to the control terminal and the second terminal of the first driving circuit 101, the control terminal of the second driving circuit 111, and a second scan line, and is configured to write a compensation voltage based on the data voltage into the control terminal of the first driving circuit 101 and the control terminal of the second driving circuit 111 under the control of a second scan signal provided by the second scan line. The storage circuit 103 can store the compensation voltage and keep the compensation voltage at the control terminal of the first driving circuit 101 and the control terminal of the second driving circuit 111. The compensation voltage can control the turn-on degree of the first driving circuit 101 and the turn-on degree of the second driving circuit 111, thereby controlling the driving current for driving the light-emitting element 200 to emit light. It should be noted that the threshold compensation circuit 105 can also perform threshold compensation on the second driving circuit 111.

For example, as shown in FIG. 1B, in some embodiments, the pixel circuit 100 further includes a first initialization circuit 106 and a second initialization circuit 107.

For example, the first initialization circuit 106 is electrically connected to the control terminal of the first driving circuit 101 and the control terminal of the second driving circuit 111, and is configured to initialize the control terminal of the first driving circuit 101 and the control terminal of the second driving circuit 111. The first initialization circuit 106 is electrically connected to the control terminal of the first driving circuit 101, the control terminal of the second driving circuit 111, a first initialization control signal line, and a first initialization voltage line, and is configured to write a first initialization voltage provided by the first initialization voltage line into the control terminal of the first driving circuit 101 and the control terminal of the second driving circuit 111 under the control of a first initialization control signal provided by the first initialization control signal line, so as to implement to initialize the control terminal of the first driving circuit 101 and the control terminal of the second driving circuit 111.

For example, the second initialization circuit 107 is electrically connected to the first electrode of the light-emitting element 200 and is configured to initialize the first electrode of the light-emitting element 200. The second initialization circuit 107 is electrically connected to the first electrode of the light-emitting element 200, a second initialization control signal line, and a second initialization voltage line, and is configured to write a second initialization voltage provided by the second initialization voltage line into the first electrode of the light-emitting element 200 under the control of a second initialization control signal provided by the second initialization control signal line, so as to implement to initialize the first electrode of the light-emitting element 200.

Figure 2:
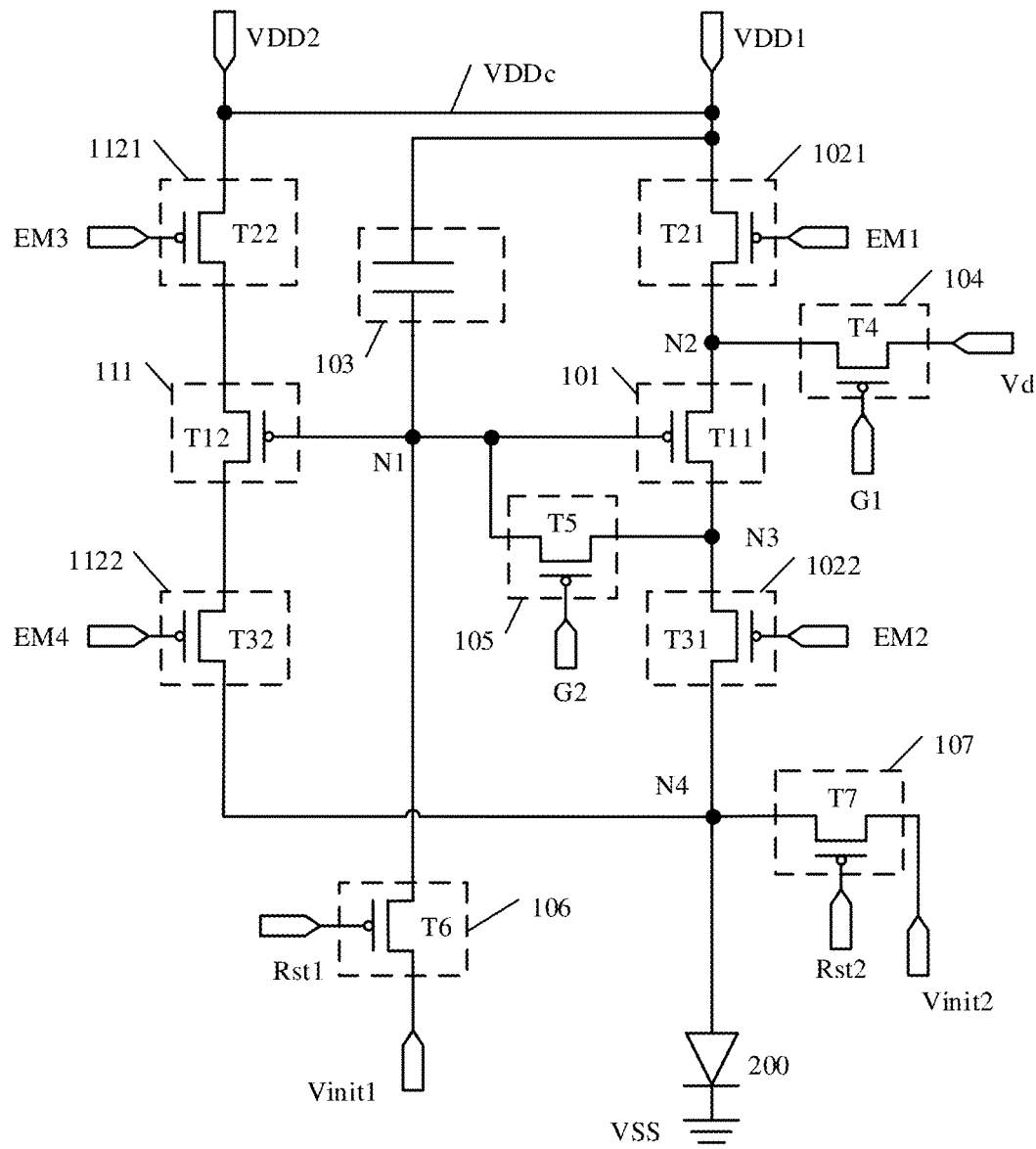
FIG. 2 is a schematic structural diagram of a pixel circuit provided by an embodiment of the present disclosure.

FIG. 2 is a schematic structural diagram of a pixel circuit provided by an embodiment of the present disclosure. The circuit structure shown in FIG. 2 is a circuit structure of a specific implementation example of the pixel circuit as shown in FIG. 1B.

For example, as shown in FIG. 2, in some embodiments, the first driving circuit 101 includes a first driving transistor T11 and the second driving circuit 111 includes a second driving transistor T12. For example, the control terminal of the first driving circuit 101 includes a gate electrode of the first driving transistor T11, the first terminal of the first driving circuit 101 includes a first electrode of the first driving transistor T11, the second terminal of the first driving circuit 101 includes a second electrode of the first driving transistor T11, the control terminal of the second driving circuit 111 includes a gate electrode of the second driving transistor T12, the first terminal of the second driving circuit 111 includes a first electrode of the second driving transistor T12, and the second terminal of the second driving circuit 111 includes a second electrode of the second driving transistor T12. For example, the gate electrode of the first driving transistor T11 can be used as the control terminal of the first driving circuit 101, the first electrode of the first driving transistor T11 is used as the first terminal of the first driving circuit 101, the second electrode of the first driving transistor T11 is used as the second terminal of the first driving circuit 101, the gate electrode of the second driving transistor T12 is used as the control terminal of the second driving circuit 111, the first electrode of the second driving transistor T12 is used as the first terminal of the second driving circuit 111, and the second electrode of the second driving transistor T12 is used as the second terminal of the second driving circuit 111.

For example, in a case where the control terminal of the first driving circuit 101 and the control terminal of the second driving circuit 111 are electrically connected to each other, the gate electrode of the first driving transistor T11 and the gate electrode of the second driving transistor T12 are electrically connected to each other. In this case, the first driving transistor T11 and the second driving transistor T12 are the same, for example, the type of the first driving transistor T11 is the same as the type of the second driving transistor T12 are the same, and the electrical parameter of the first driving transistor T11 is the same as the electrical parameter of the second driving transistor T12, that is, the threshold voltage of the first driving transistor T11 is the same as the threshold voltage of the second driving transistor T12, so that when the threshold compensation circuit 105 performs threshold compensation on the first driving transistor T11 of the first driving circuit 101, in fact, the threshold voltage of the second driving transistor T12 is also compensated. For example, the above-mentioned compensation voltage may include the data voltage and the threshold old voltage of the first driving transistor T11, for example, the above-mentioned compensation voltage may be the sum of the data voltage and the threshold voltage of the first driving transistor T11.

For example, the first driving transistor T11 and the second driving transistor T12 are both P-type transistors.

For example, the gate electrode of the first driving transistor T11 and the gate electrode of the second driving transistor T12 are both electrically connected to a node N1, the first electrode of the first driving transistor T11 is electrically connected to a node N2, and the second electrode of the first driving transistor T11 is electrically connected to a node N3.

For example, as shown in FIG. 2, the first light-emitting control circuit 102 includes a first light-emitting control sub-circuit 1021 and a second light-emitting control sub-circuit 1022.

For example, the first light-emitting control sub-circuit 1021 is connected to the first terminal of the first driving circuit 101 and the first power line VDD1, and is configured to turn on or off the connection between the first terminal of the first driving circuit 101 and the first power line VDD1. For example, the first light-emitting control sub-circuit 1021 is also electrically connected to the first light-emitting control signal line, so that the first light-emitting control sub-circuit 1021 can achieve the connection between the first terminal of the first driving circuit 101 and the first power line VDD1 to be turned on or off under the control of the first light-emitting control signal.

For example, the second light-emitting control sub-circuit 1022 is electrically connected to the second terminal of the first driving circuit 101 and the first electrode of the light-emitting element 200, and is configured to turn on or off the connection between the second terminal of the first driving circuit 101 and the first electrode of the light-emitting element 200. For example, the second light-emitting control sub-circuit 1022 is also electrically connected to the second light-emitting control signal line, so that the second light-emitting control sub-circuit 1022 can achieve the connection between the second terminal of the first driving circuit 101 and the first electrode of the light-emitting element 200 to be turned on or off under the control of the second light-emitting control signal.

For example, as shown in FIG. 2, the second light-emitting control circuit 112 includes a third light-emitting control sub-circuit 1121 and a fourth light-emitting control sub-circuit 1122.

For example, the third light-emitting control sub-circuit 1121 is connected to the first terminal of the second driving circuit 111 and the second power line VDD2, and is configured to turn on or off the connection between the first terminal of the second driving circuit 111 and the second power line VDD2. For example, the third light-emitting control sub-circuit 1121 is also electrically connected to the third light-emitting control signal line, so that the third light-emitting control sub-circuit 1121 can achieve the connection between the first terminal of the second driving circuit 111 and the second power line VDD2 to be turned on or off under the control of the third light-emitting control signal.

For example, the fourth light-emitting control sub-circuit 1122 is electrically connected to the second terminal of the second driving circuit 111 and the first electrode of the light-emitting element 200, and is configured to turn on or off the connection between the second terminal of the second driving circuit 111 and the first electrode of the light-emitting element 200. For example, the fourth light-emitting control sub-circuit 1122 is also electrically connected to the fourth light-emitting control signal line, so that the fourth light-emitting control sub-circuit 1122 can achieve the connection between the second terminal of the second driving circuit 111 and the first electrode of the light-emitting element 200 to be turned on or off under the control of the fourth light-emitting control signal.

For example, as shown in FIG. 2, in some embodiments, the first light-emitting control sub-circuit 1021 includes a first light-emitting control transistor T21, the second light-emitting control sub-circuit 1022 includes a second light-emitting control transistor T31, the third light-emitting control sub-circuit 1121 includes a third light-emitting control transistor T22, the fourth light-emitting control sub-circuit 1122 includes a fourth light-emitting control transistor T32, the data writing circuit 104 includes a data writing transistor T4, the storage circuit 103 includes a storage capacitor C, the threshold compensation circuit 105 includes a threshold compensation transistor T5, the first initialization circuit 106 includes a first initialization transistor T6, and the second initialization circuit 107 includes a second initialization transistor T7.

For example, a first electrode of the data writing transistor T4 is electrically connected to the data line Vd to receive the data voltage, a second electrode of the data writing transistor T4 is electrically connected to the first electrode of the first driving transistor T11, that is, the node N2, and a gate electrode of the data writing transistor T4 is electrically connected to the first scan line G1 to receive the first scan signal. The data writing transistor T4 is used to write the data voltage into the first electrode of the first driving transistor T11 under the control of the first scan signal.

For example, a first electrode of the threshold compensation transistor T5 is electrically connected to the second electrode of the first driving transistor T11, that is, the node N3, a second electrode of the threshold compensation transistor T5 is electrically connected to the gate electrode of the first driving transistor T11 and the gate electrode of the second driving transistor T12, that is, the node N1, and a gate electrode of the threshold compensation transistor T5 is electrically connected to the second scan line to receive the second scan signal. When the threshold compensation transistor T5 is turned on under the control of the second scan signal, the first driving transistor T11 is connected in a diode connection mode.

For example, the data writing transistor T4 and the threshold compensation transistor T5 can be turned on at the same time.

For example, the first scan signal and the second scan signal can be the same. In some embodiments, the first scan line G1 and the second scan line G2 are the same signal line to transmit the same signal, thereby saving the number of signal lines and reducing the manufacturing cost. In this case, the gate electrode of the data writing transistor T4 and the gate electrode of the threshold compensation transistor T5 may be electrically connected to the same signal line, such as the first scan line G1, to receive the same signal. However, the present disclosure is not limited to this case. The first scan line G1 and the second scan line G2 can also be different signal lines, so that the data writing transistor T4 and the threshold compensation transistor T5 can be separately and independently controlled, thereby increasing the flexibility of controlling the pixel circuit. For example, the first scan signal and the second scan signal may also be different, as long as the first scan signal and the second scan signal can cause the data writing transistor T4 and the threshold compensation transistor T5 to be turned on at the same time.

For example, a first electrode of the first light-emitting control transistor T21 is electrically connected to the first power line VDD1, a second electrode of the first light-emitting control transistor T21 is electrically connected to the first electrode of the first driving transistor T11, and a gate electrode of the first light-emitting control transistor T21 is electrically connected to the first light-emitting control signal line EM1 to receive the first light-emitting control signal. When the first light-emitting control transistor T21 is turned on under the control of the first light-emitting control signal, the first power line VDD1 and the first electrode of the first driving transistor T11 are electrically connected.

For example, a first electrode of the second light-emitting control transistor T31 is electrically connected to the second electrode of the first driving transistor T11, namely the node N3, a second electrode of the second light-emitting control transistor T31 is electrically connected to the first electrode of the light-emitting element 200, namely the node N4, and a gate electrode of the second light-emitting control transistor T31 is electrically connected to the second light-emitting control signal line EM2 to receive the second light-emitting control signal. When the second light-emitting control transistor T31 is turned on under the control of the second light-emitting control signal, the second electrode of the first driving transistor T11 is electrically connected to the first electrode of the light-emitting element 200.

For example, a first electrode of the third light-emitting control transistor T22 is electrically connected to the second power line VDD2, a second electrode of the third light-emitting control transistor T22 is electrically connected to the first electrode of the second driving transistor T12, and a gate electrode of the third light-emitting control transistor T22 is electrically connected to the third light-emitting control signal line EM3 to receive the third light-emitting control signal. When the third light-emitting control transistor T22 is turned on under the control of the third light-emitting control signal, the second power line VDD2 and the first electrode of the second driving transistor T12 are electrically connected.

For example, a first electrode of the fourth light-emitting control transistor T32 is electrically connected to the second electrode of the second driving transistor T12, a second electrode of the fourth light-emitting control transistor T32 is electrically connected to the first electrode of the light-emitting element 200, and a gate electrode of the fourth light-emitting control transistor T32 is electrically connected to the fourth light-emitting control signal line EM4 to receive the fourth light-emitting control signal. When the fourth light-emitting control transistor T32 is turned on under the control of the fourth light-emitting control signal, the second electrode of the second driving transistor T12 is electrically connected to the first electrode of the light-emitting element 200.

For example, the first light-emitting control transistor T21, the second light-emitting control transistor T31, the third light-emitting control transistor T22, and the fourth light-emitting control transistor T32 can be turned on at the same time, so that the first driving transistor T11 and the second driving transistor T12 simultaneously drive the light-emitting element 200 to emit light.

For example, in some embodiments, the first light-emitting control signal, the second light-emitting control signal, the third light-emitting control signal, and the fourth light-emitting control signal may be the same, for example, the first light-emitting control signal line EM1, the second light-emitting control signal line EM2, the third light-emitting control signal line EM3, and the fourth light-emitting control signal line EM4 are the same signal line, that is, the gate electrode of the first light-emitting control transistor T21, the gate electrode of the second light-emitting control transistor T31, the gate electrode of the third light-emitting control transistor T22, and the gate electrode of the fourth light-emitting control transistor T32 may be electrically connected to the same signal line, for example, the first light-emitting control signal line EM1, to receive the same signal (for example, the first light-emitting control signal). In this case, the second light-emitting control signal line EM2, the third light-emitting control signal line EM3, and the fourth light-emitting control signal line EM4 may not be provided, thereby reducing the number of signal lines. For another example, the gate electrode of the first light-emitting control transistor T21, the gate electrode of the second light-emitting control transistor T31, the gate electrode of the third light-emitting control transistor T22, and the gate electrode of the fourth light-emitting control transistor T32 can also be electrically connected to different signal lines, that is, the gate electrode of the first light-emitting control transistor T21 is electrically connected to the first light-emitting control signal line EM1, the gate electrode of the second light-emitting control transistor T31 is electrically connected to the second light-emitting control signal line EM2, the gate electrode of the third light-emitting control transistor T22 is electrically connected to the third light-emitting control signal line EM3, the gate electrode of the fourth light-emitting control transistor T32 is electrically connected to the fourth light-emitting control signal line EM4, and the signal transmitted by the first light-emitting control signal line EM1, the signal transmitted by the second light-emitting control signal line EM2, the signal transmitted by the third light-emitting control signal line EM3, and the signal transmitted by the fourth light-emitting control signal line EM4 are the same.

It should be noted that the first light-emitting control signal, the second light-emitting control signal, the third light-emitting control signal, and the fourth light-emitting control signal may also be different, and the embodiments of the present disclosure are not limited to this case.

For example, a first electrode of the first initialization transistor T6 is electrically connected to a first initialization voltage line Vinit1, a second electrode of the first initialization transistor T6 is electrically connected to the gate electrode of the first driving transistor T11 and the gate electrode of the second driving transistor T12, and a gate electrode of the first initialization transistor T6 is electrically connected to a first initialization control signal line Rst1. When the first initialization transistor T6 is turned on under the control of a first initialization control signal provided by the first initialization control signal line Rst1, the first initialization transistor T6 transmits a first initialization voltage provided by the first initialization voltage line Vinit to the gate electrode of the first driving transistor T11 and the gate electrode of the second driving transistor T12, so as to achieve to initialize the gate electrode of the first driving transistor T11 and the gate electrode of the second driving transistor T12.

For example, a first electrode of the second initialization transistor T7 is electrically connected to a second initialization voltage line Vinit2, a second electrode of the second initialization transistor T7 is electrically connected to the first electrode of the light-emitting element 200, that is, the node N4, and a gate electrode of the second initialization transistor T7 is electrically connected to a second initialization control signal line Rst2. When the second initialization transistor T7 is turned on under the control of a second initialization control signal provided by the second initialization control signal line Rst2, the second initialization transistor T7 transmits a second initialization voltage provided by the second initialization voltage line Vinit2 to the first electrode of the light-emitting element 200, so as to achieve to initialize the first electrode of the light-emitting element 200.

For example, in some embodiments, the first initialization control signal and the second initialization control signal may be the same, in some examples, the first initialization control signal line Rst1 and the second initialization control signal line Rst2 are the same signal line, that is, the gate electrode of the first initialization transistor T6 and the gate electrode of the second initialization transistor T7 may be electrically connected to the same signal line, such as the first initialization control signal line Rst1, to receive the same signal (for example, the first initialization control signal). In this case, the second initialization control signal line Rst2 may not be provided, thereby reducing the number of signal lines. In other examples, the gate electrode of the first initialization transistor T6 and the gate electrode of the second initialization transistor T7 can also be electrically connected to different signal lines, that is, the gate electrode of the first initialization transistor T6 is electrically connected to the first initialization control signal line Rst1, and the gate electrode of the second initialization transistor T7 is electrically connected to the second initialization control signal line Rst2, while the signal transmitted by the first initialization control signal line Rst1 and the signal transmitted by the second initialization control signal line Rst2 are the same. For another example, in other embodiments, the first initialization control signal and the second initialization control signal may be different, for example, the first initialization control signal line Rst1 and the second initialization control signal line Rst2 are different signal lines, so that the first initialization transistor T6 and the second initialization transistor T7 can be separately and independently controlled, and the flexibility of controlling the pixel circuit can be increased.

For example, in some example, a plurality of sub-pixels arranged in N rows and M columns are arranged on the display panel, and second initialization circuits in pixel circuits of sub-pixels in an n-th row among the N rows and first initialization circuits in pixel circuits of sub-pixels in an (n+1)-th row among the N rows are controlled by the same initialization control signal line, that is, the second initialization control signal line connected to the second initialization circuits in the pixel circuits of the sub-pixels in the n-th row and the first initialization control signal line connected to the first initialization circuits in the pixel circuits of the sub-pixels in the (n+1)-th row are the same signal line, so that the number of signal lines can be saved. For example, N, M, and n are positive integers, and n is less than N. Similarly, the second initialization voltage line Vinit2 connected to the second initialization circuits in the pixel circuits of the sub-pixels in the n-th row and the first initialization voltage line Vinit1 connected to the first initialization circuits in the pixel circuits of the sub-pixels in the (n+1)-th row are the same signal line.

For example, the first initialization voltage line Vinit1 and the second initialization voltage line Vinit2 can transmit a constant DC voltage. The first initialization voltage line Vinit1 and the second initialization voltage line Vinit2 can be electrically connected to a high voltage terminal or a low voltage terminal, as long as the first initialization voltage line Vinit1 and the second initialization voltage line Vinit2 can provide the first initialization voltage and the second initialization voltage to initialize the gate electrode of the first driving transistor T11, the gate electrode of the second driving transistor T12, and the first electrode of the light-emitting element 200, and the present disclosure does not limit this.

For example, a first electrode of the storage capacitor C is electrically connected to the gate electrode of the first driving transistor T11 and the gate electrode of the second driving transistor T12, and a second electrode of the storage capacitor C is electrically connected to the first power line VDD1. For example, in other examples, the second electrode of the storage capacitor C may also be electrically connected to a second power line VDD2.

For example, as shown in FIG. 2, in the embodiments of the present disclosure, by adding an additional driving circuit (i.e., the second driving transistor T12), two driving circuits (i.e., the first driving transistor T11 and the second driving transistor T12) are connected to the light-emitting element 200, so that the purpose of theoretically increasing the driving current flowing through the light-emitting element 200 by twice the driving current of the original driving circuit can be achieved.

It should be noted that the first driving circuit 101, the second driving circuit 111, the first light-emitting control circuit 102, the second light-emitting control circuit 112, the storage circuit 103, the data writing circuit 104, the threshold compensation circuit 105, the first initialization circuit 106, and the second initialization circuit 107 in the pixel circuit shown in FIG. 2 are only schematic. The specific structures of the circuits such as the first driving circuit 101, the second driving circuit 111, the first light-emitting control circuit 102, the second light-emitting control circuit 112, the storage circuit 103, the data writing circuit 104, the threshold compensation circuit 105, the first initialization circuit 106, and the second initialization circuit 107 can be set according to the actual application requirements, and the embodiments of the present disclosure do not specifically limit the specific structure of the circuits. In addition, according to the actual situation, the pixel circuit 100 may also include more or less circuits.

For example, as shown in FIG. 2, the pixel circuit 100 further includes a power connection line VDDc1. The first power line VDD1 and the second power line VDD2 are electrically connected to each other through the power connection line VDDc1.

For example, the timing diagram of the pixel circuit can be set according to actual requirements, and is not specifically limited by the embodiments of the present disclosure. Next, with reference to the pixel circuit shown in FIG. 2, respective working phases of the pixel circuit will be briefly described.

For example, as shown in FIG. 2, in an initialization phase, the first initialization transistor T6 and the second initialization transistor T7 are turned on, the first initialization voltage is transmitted to the gate electrode of the first driving transistor T11 and the gate electrode of the second driving transistor T12 via the first initialization transistor T6, so that the voltage of the gate electrode of the first driving transistor T11 and the voltage of the gate electrode of the second driving transistor T12 are initialized to the first initialization voltage. The second initialization voltage is transmitted to the first electrode of the light-emitting element 200 via the second initialization transistor T7, so that the voltage of the first electrode of the light-emitting element 200 is initialized to the second initialization voltage. At this time, the first driving transistor T11 and the second driving transistor T12 may be in the turn-on state.

For example, as shown in FIG. 2, in a data writing and compensation phase, the data writing transistor T4 and the threshold compensation transistor T5 are turned on, and the data voltage is written into the node N1, that is, the gate electrode of the first driving transistor T11 and the gate electrode of the second driving transistor T12, via the data writing transistor T4 and the threshold compensation transistor T5, and the first driving transistor T11 is turned off when the voltage at the node N1 becomes a sum (that is, Vdata+Vth1) of the data voltage Vdata and the threshold voltage Vth1 of the first driving transistor T11, the data writing and compensation phase ends.

For example, the first driving transistor T11 and the second driving transistor T12 transmit the driving current to the light-emitting element 200 in a light-emitting phase to drive the light-emitting element 200 to emit light. As shown in FIG. 2, in the light-emitting phase, the first light-emitting control transistor T21, the second light-emitting control transistor T31, the third light-emitting control transistor T22, and the fourth light-emitting control transistor T32 are all turned on, a first power voltage output by the first power line VDD1 can be transmitted to the first electrode of the first driving transistor T11 via the first light-emitting control transistor T21, and the voltage at the first electrode of the first driving transistor T11 becomes the first power voltage. The first power voltage output by the first power line VDD1 can be transmitted to the first electrode of the first driving transistor T11 via the first light-emitting control transistor T21, and the voltage at the first electrode of the first driving transistor T11 becomes the first power voltage, the second power voltage output by the second power line VDD2 can be transmitted to the first electrode of the second driving transistor T12 via the second light-emitting control transistor T22, the voltage at the first electrode of the second driving transistor T12 becomes the second power voltage, and the first power voltage is the same as the second power voltage.

Therefore, based on a saturation current formula of the first driving transistor T11 and the second driving transistor T12, it can be obtained that the driving current $I_{OLED}$ flowing to the light-emitting element 200 can be expressed as:

$$I_{OLED} = K1*(Vgs1 - Vth1) + K2*(Vgs2 - Vth2) =$$
$$K1*((Vdata + Vth1) - Vdd1 - Vth1) +$$
$$K2*((Vdata + Vth1) - Vdd2 - Vth2), =$$
$$K1*(Vdata - Vdd1) + K2*(Vdata - Vdd2)$$

where $I_{OLED}$ represents the driving current, K1 is a process constant of the first driving transistor T11, Vgs1 is a voltage difference between the gate electrode and the first electrode of the first driving transistor T11 in the light-emitting phase, Vth1 is a threshold voltage of the first driving transistor T11, K2 is a process constant of the second driving transistor T12, Vgs2 is a voltage difference between the gate electrode and the first electrode of the second driving transistor T12 in the light-emitting phase, Vh2 is a threshold voltage of the second driving transistor T12, Vth1 and Vth2 are the same, Vdd1 represents the first power voltage, Vdd2 represents the second power voltage, and Vdata represents the data voltage.

It can be seen from the above formula that the driving current $I_{OLED}$ is not affected by the threshold voltage of the first driving transistor T11 and the threshold voltage of the second driving transistor T12, but only related to the first power voltage/second power voltage and the data voltage Vdata. The data voltage Vdata is directly transmitted by the data line Vd, which has nothing to do with the threshold voltage of the first driving transistor T11 and the threshold voltage of the second driving transistor T12. In this way, the problem of the threshold voltage drift of the first driving transistor T11 and the threshold voltage drift of the second driving transistor T12 due to the technological process and long-term operation can be solved, the accuracy of the driving current $I_{OLED}$ can be ensured, it can be ensured that the light-emitting element 200 works normally, the uniformity of the display picture can be improved, and the display effect can be improved.

For example, in the above formula, K1 is represented by K1=$0.5*\mu_{n1}C_{ox1}$ (W1/L1), K2 is represented by K2=$0.5*\mu_{n2}C_{ox2}$ (W2/L2), where $\mu_{n1}$ is an electron mobility of the first driving transistor T11, $C_{ox1}$ is a gate unit capacitance of the first driving transistor T11, W1 is a channel width of the first driving transistor T11, and L1 is a channel length of first driving transistor T11, $\mu_{n2}$ is an electron mobility of the second driving transistor T12, $C_{ox2}$ is a gate unit capacitance of the second driving transistor T12, W2 is a channel width of the second driving transistor T12, and L2 is a channel length of the second driving transistor T12.

For example, the pixel circuit 100 is located on a base substrate (which will be described later). The pixel circuit 100 has a first functional layer and a second functional layer, which are located on the base substrate, and in a direction perpendicular to the base substrate, the first functional layer is located on a side of the second functional layer away from the base substrate, the first power line VDD1 and the second power line VDD2 are located in the first functional layer, and the power connection line VDDc1 is located in the second functional layer. That is, the power connection line VDDc1 is located in a layer different from the layer where the first power line VDD1 and the second power line VDD2 are located, and the power connection line VDDc1 is electrically connected to the first power line VDD1 and the second power line VDD2 through two holes, respectively.

For example, the pixel circuit 100 further includes a first gate connection line, a second gate connection line, and a third gate connection line (not shown in FIG. 2). The control terminal of the first driving circuit 101 and the control terminal of the second driving circuit 111 are electrically connected through the first gate connection line, the second gate connection line, and the third gate connection line, the control terminal of the first driving circuit 101 is electrically connected to the first gate connection line, the control terminal of the second driving circuit 111 is electrically connected to the second gate connection line, and the third gate connection line is used to electrically connect the first gate connection line and the second gate connection line to achieve to connect the control terminal of the first driving circuit 101 to the control terminal of the second driving circuit 111. For example, when the first driving circuit 101 includes the first driving transistor T11 and the second driving circuit 111 includes the second driving transistor T12, the gate electrode of the first driving transistor T11 is electrically connected to the first gate connection line, and the gate electrode of the second driving transistor T12 is electrically connected to the second gate connection line.

For example, the first gate connection line and the second gate connection line are located in the first functional layer, and the third gate connection line is located in the second functional layer, that is, the third gate connection line is located in a layer different from the layer where the first gate connection line and the second gate connection line are located, and the third gate connection line is connected to the first gate connection line and the second gate connection line through two holes, respectively.

For example, the pixel circuit 100 also has a third functional layer, the first functional layer, the second functional layer, and the third functional layer are stacked on each other, the third functional layer is also located on the base substrate, and in the direction perpendicular to the base substrate, the second functional layer is located between the first functional layer and the third functional layer, the second functional layer is located on a side of the third functional layer away from the base substrate, and the first functional layer is located on a side of the second functional layer away from the base substrate.

For example, the first scan line G1, the second scan line G2, the first initialization control signal line Rst1, the second initialization control signal line Rst2, the first light-emitting control signal line EM1, the second light-emitting control signal line EM2, the third light-emitting control signal line EM3, and the fourth light-emitting control signal line EM4 are located in the third functional layer; the data line Vd is located in the first functional layer, and the first initialization voltage line Vinit1 and the second initialization voltage line Vinit2 are located in the second functional layer.

For example, the first functional layer, the second functional layer, and the third functional layer will be described in detail below, which will not be described here. For example, the first functional layer can be a source-drain metal layer, the second functional layer can be a second gate metal layer, and the third functional layer can be a first gate metal layer.

Figure 3A:
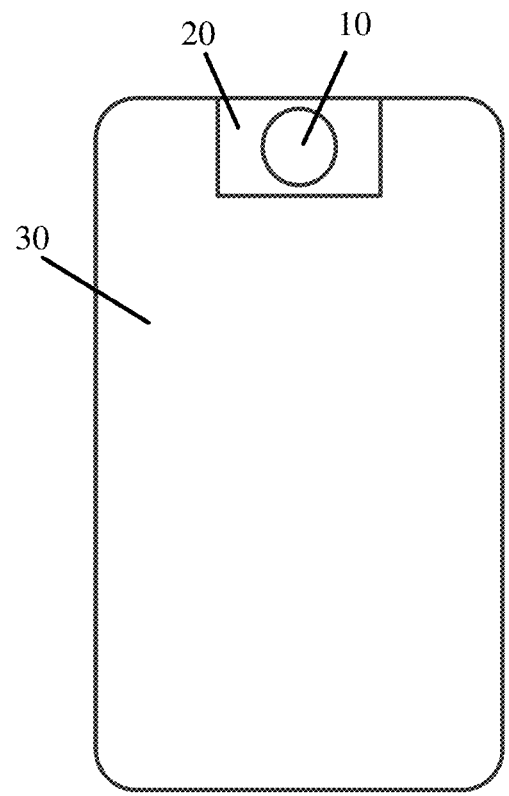
FIG. 3A is a schematic plan view of a display substrate provided by some embodiments of the present disclosure.
Figure 3B:
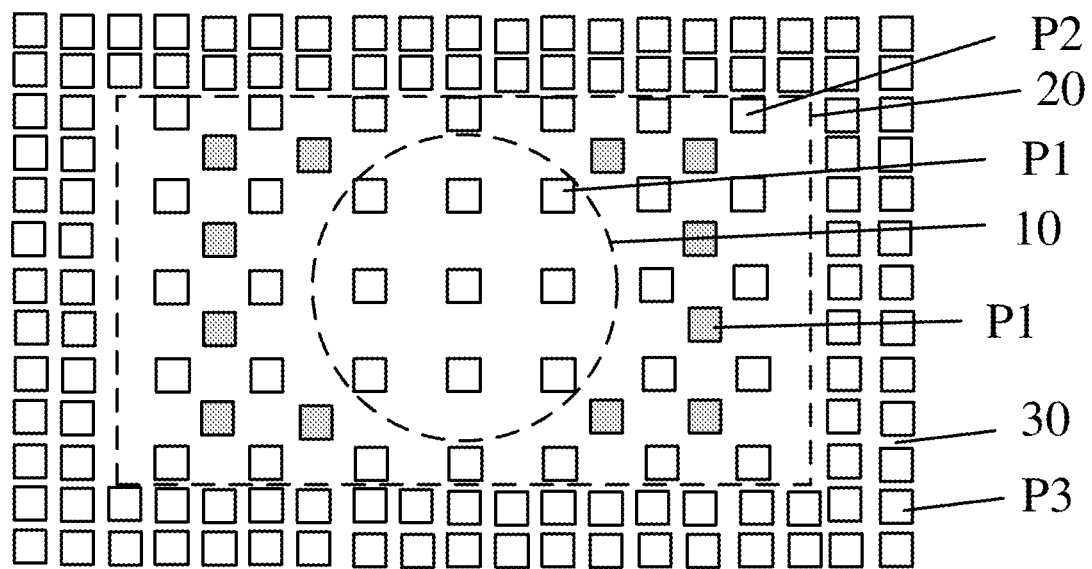
FIG. 3B is a schematic diagram of an arrangement of sub-pixels on a display substrate provided by some embodiments of the present disclosure.

FIG. 3A is a schematic plan view of a display substrate provided by some embodiments of the present disclosure, and FIG. 3B is a schematic diagram of an arrangement of sub-pixels on a display substrate provided by some embodiments of the present disclosure.

At least one embodiment of the present disclosure provides a display substrate. For example, as shown in FIG. 3A, the display substrate has a first side for display (that is, the display side) and a second side opposite to the first side (that is, the non-display side, which can also be called the back side). For example, the display substrate also includes a base substrate, the base substrate includes a first display region 10 and a second display region 20 that at least partially surrounds (in the example shown in FIG. 3a, completely surrounds) the first display region 10. The first display region 10 allows light from the first side to be at least partially transmitted to the second side, that is, the first display region 10 is a transparent display region, and light can reach the non-display side from the display side of the display substrate through the transparent display region. On the non-display side, for example, sensors such as cameras and infrared sensors can be arranged. For example, the sensor can be arranged under the second display region 20, and the sensor can collect and use the light transmitted from the first display region 10 to the non-display side to perform the sensing operation such as imaging, image shooting, distance detection, light intensity detection, and so on.

For example, the display substrate may include a plurality of sub-pixels, each sub-pixel includes the pixel circuit and the light-emitting element described in any one of the above embodiment. For example, as shown in FIG. 3B, the plurality of sub-pixels includes a plurality of first sub-pixels P1 and a plurality of second sub-pixels P2.

For example, the plurality of first sub-pixels P1 are arranged in an array in the first display region 10, each first sub-pixel P1 includes a light-emitting element and a pixel circuit, the light-emitting elements (white boxes in the first display region 10 in FIG. 3B) of the plurality of first sub-pixels P1 are located in the first display region 10, and the pixel circuits (gray boxes in the second display region 20 in FIG. 3B) of the plurality of first sub-pixels P1 are located in the second display region 20. The pixel circuit of the first sub-pixel P1 is used to drive the light-emitting element of the first sub-pixel P1. That is, the pixel circuits of the plurality of first sub-pixels P1 in the first display region 10 are arranged in the second display region 20, so that it can be avoided that too many structures or opaque structures are arranged in the first display region 10, thus ensuring the light transmittance of the first display region 10, facilitating transmitting more light for being sensed by the sensor, and improving the sensing quality.

For example, the plurality of second sub-pixels P2 are arranged in an array in the second display region 20, each second sub-pixel P2 includes a light-emitting element and a pixel circuit electrically connected to the light-emitting element, and the pixel circuit of the second sub-pixel P2 is configured to drive the light-emitting element of the second sub-pixel P2 to emit light. The light-emitting elements and the pixel circuits of the plurality of second sub-pixels P2 (that is, the white boxes in the second display region 20 in FIG. 3B include the light-emitting elements and the pixel circuits of the second sub-pixels P2) are all located in the second display region 20. For example, in the direction perpendicular to the base substrate, the light-emitting element of the second sub-pixel P2 and the pixel circuit of the second sub-pixel P2 are stacked on each other, and the light-emitting element of the second sub-pixel P2 is arranged on a side of the pixel circuit of the second sub-pixel P2 close to the display side.

For example, the light-emitting elements of the plurality of first sub-pixels P1 and the light-emitting elements of the plurality of second sub-pixels P2 are uniformly arranged in the first display region 10 and the second display region 20, respectively, so that the first display region 10 and the second display region 20 can emit light and display uniformly as a whole.

For example, as shown in FIG. 3A, the base substrate further includes a third display region 30 at least partially surrounding the second display region 20. For example, the first display region 10, the second display region 20, and the third display region 30 do not overlap each other. It should be note that in some examples, the base substrate may further include a peripheral region that at least partially surrounds the third display region 30.

For example, as shown in FIG. 3B, a plurality of third sub-pixels P3 arranged in an array are arranged in the third display region 30, and the light-emitting elements and the pixel circuits of the plurality of third sub-pixels P3 are all located in the third display region 30. For example, the pixel circuit of the third sub-pixel P3 may include seven transistors and a capacitor, for example, may be the circuit composed of the transistors T11, T21, T31, T4-T7 and the capacitor C shown in FIG. 2, that is, the pixel circuit of the third sub-pixel P3 has a conventional 7T1C pixel circuit structure.

For example, a distribution density per unit area of the light-emitting elements of the plurality of third sub-pixels P3 in the third display region 30 is greater than a distribution density per unit area of the light-emitting elements of the plurality of first sub-pixels P1 in the first display region 10 and a distribution density per unit area of the light-emitting elements of the plurality of second sub-pixels P2 in the second display region 20. For example, the distribution density per unit area of the light-emitting elements in the first display region 10 is smaller than the distribution density per unit area of the light-emitting elements in the second display region 20. For example, the first display region 10 and the second display region 20 can be referred to as the low pixel density region of the display substrate, and correspondingly, the third display region 30 can be referred to as the high pixel density region of the display substrate. It should be noted that in some examples, the distribution density per unit area of the light-emitting elements in the first display region 10 can also be equal to the distribution density per unit area of the light-emitting elements in the second display region 20, which can be determined according to actual requirements, and the embodiments of the present disclosure are not limited to this case.

For example, the arrangement of the plurality of first sub-pixels P1/the plurality of second sub-pixels P2/the plurality of third sub-pixels P3 can refer to the conventional arrangement of sub-pixels, such as GGRB, RGBG, RGB, etc., which is not limited by the embodiments of the present disclosure.

For example, a shape of the first display region 10 may be substantially circular or elliptical, a shape of the second display region 20 may be substantially a rectangle with a hollowed-out circle or ellipse, and a shape of the third display region 30 may be substantially a rectangle with a hollowed-out rectangle, but the embodiments of the present disclosure are not limited thereto. For example, the shape of the first display region 10, the shape of the second display region 20, and the shape of the third display region 30 may all be rectangular or other suitable shapes. It should be noted that although the shape of the first display region 10, the shape of the second display region 20, and the shape of the third display region 30 shown in FIGS. 3A and 3B are all regular shapes, in the actual layout, the shape of the first display region 10, the shape of the second display region 20, and the shape of the third display region 30 may be irregular, for example, the shape of the first display region 10 is actually an irregular circle.

Figure 4A:
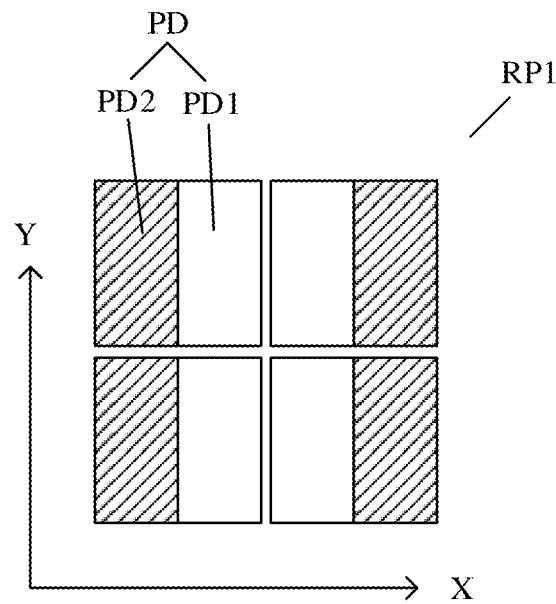
FIG. 4A is a schematic diagram of an arrangement of a first repeating unit provided by some embodiments of the present disclosure.
Figure 4B:
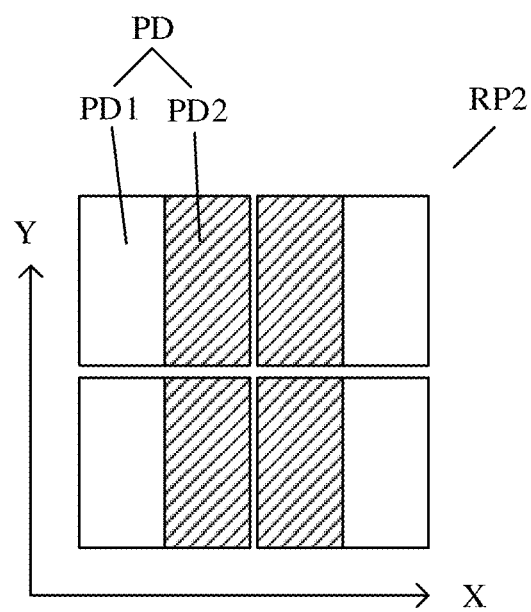
FIG. 4B is a schematic diagram of an arrangement of a second repeating unit provided by some embodiments of the present disclosure.
Figure 4C:
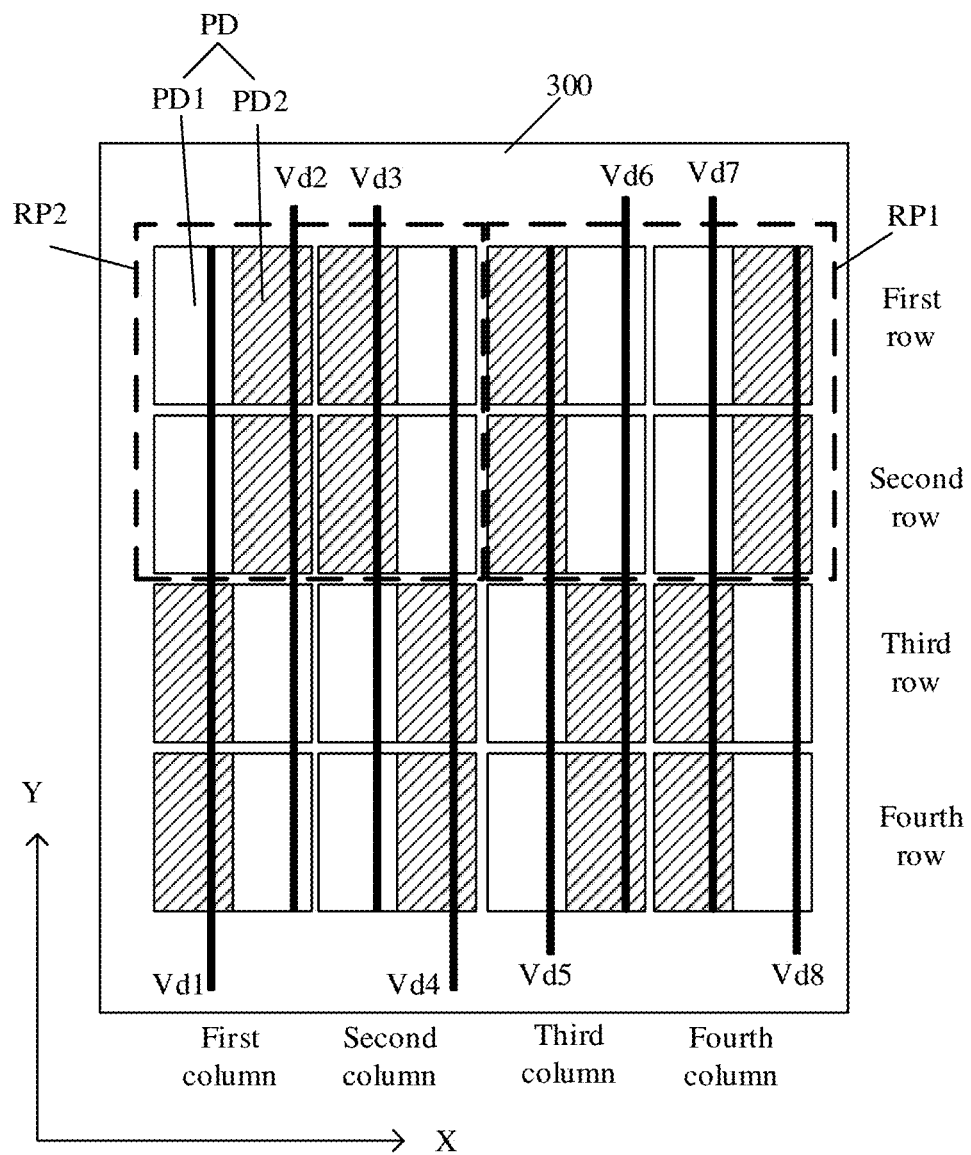
FIG. 4C is a schematic diagram of an arrangement of pixel regions provided by some embodiments of the present disclosure.
Figure 4D:
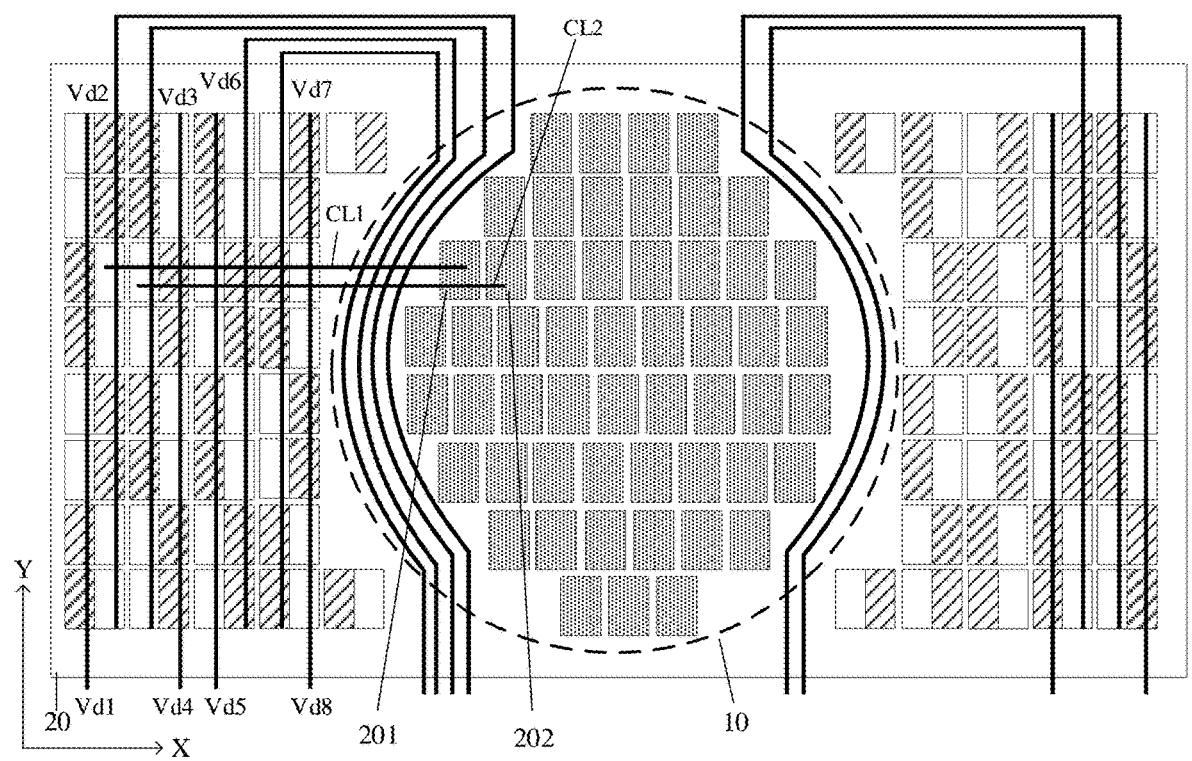
FIG. 4D is a schematic diagram of another arrangement of pixel regions provided by some embodiments of the present disclosure.

FIG. 4A is a schematic diagram of an arrangement of a first repeating unit provided by some embodiments of the present disclosure, FIG. 4B is a schematic diagram of an arrangement of a second repeating unit provided by some embodiments of the present disclosure, FIG. 4C is a schematic diagram of an arrangement of pixel regions provided by some embodiments of the present disclosure, and FIG. 4D is a schematic diagram of another arrangement of pixel regions provided by some embodiments of the present disclosure.

For example, as shown in FIG. 4C, the first display region 10 includes a plurality of pixel regions PD corresponding to the pixel circuits of the plurality of first sub-pixels and the pixel circuits of the plurality of second sub-pixels. The plurality of pixel regions PD are arranged in a plurality of rows and a plurality of columns, and FIG. 4C shows the pixel regions PD arranged in four rows and four columns. As shown in FIG. 4C, a first direction X is a row direction of the plurality of pixel regions PD, and a second direction Y is a column direction of the plurality of pixel regions PD, for example, the first direction X and the second direction Y are perpendicular to each other.

For example, as shown in FIG. 4C, each of the plurality of pixel regions PD includes a first sub-region PD1 and a second sub-region PD2 that do not overlap each other. It should be noted that a shaded rectangular region in FIG. 4C represents the second sub-region PD2.

For example, the first driving circuit, the first light-emitting control circuit, the storage circuit, and the data writing circuit in the pixel circuit 100 are located in the first sub-region PD1 of the corresponding pixel region PD, for example, the first initialization circuit, the second initialization circuit, and the threshold compensation circuit in the pixel circuit 100 are also located in the first sub-region PD1 of the corresponding pixel region PD; the second driving circuit and the second light-emitting control circuit in the pixel circuit 100 are located in the second sub-region PD2 of the corresponding pixel region PD. That is, the first driving transistor T11, the first light-emitting control transistor T21, the second light-emitting control transistor T31, the data writing transistor T4, the threshold compensation transistor T5, the first initialization transistor T6, and the second initialization transistor T7 are located in the first sub-region PD1 of the corresponding pixel region PD, while the second driving transistor T12, the third light-emitting control transistor T22, and the fourth light-emitting control transistor T32 are located in the second sub-region PD2 of the corresponding pixel region PD.

For example, in some embodiments, the area of the first sub-region PD1 may be equal to the area of the second sub-region PD2, but the present disclosure is not limited to this case, and the area of the first sub-region PD1 and the area of the second sub-region PD2 are determined according to actual conditions.

For example, as shown in FIGS. 4A to 4C, the first sub-region PD1 of each pixel region PD includes a first side and a second side opposite to each other in the first direction X. For example, the first side of the first sub-region PD1 is a left side in FIGS. 4A to 4C, and the second side of the first sub-region PD1 is a right side in FIGS. 4A to 4C. It should be noted that "left side" and "right side" are divided from the perspective of the viewer.

For example, the pixel circuits of the plurality of first sub-pixels P1 constitute a plurality of first repeating units RP1, and the pixel circuits of the plurality of second sub-pixels P2 constitute a plurality of second repeating units RP2. For example, each first repeating unit RP1 includes pixel circuits of four first sub-pixels arranged in two rows and two columns, and each second repeating unit RP2 includes pixel circuits of four second sub-pixels arranged in two rows and two columns.

For example, as shown in FIG. 4A, in the first repeating unit RP1, a second sub-region PD2 in a pixel region PD corresponding to a pixel circuit, among the pixel circuits of the four first sub-pixels P1, of a first sub-pixel P1 located in a first row and a first column is located on a first side of a first sub-region PD1 in the pixel region PD corresponding to the pixel circuit of the first sub-pixel P1 located in the first row and the first column; a second sub-region PD2 in a pixel region PD corresponding to a pixel circuit, among the pixel circuits of the four first sub-pixels P1, of a first sub-pixel P1 located in a second row and the first column is located on a first side of the first sub-region PD1 in the pixel region PD corresponding to the pixel circuit of the first sub-pixel P1 located in the second row and the first column; a second sub-region PD2 in a pixel region PD corresponding to a pixel circuit, among the pixel circuits of the four first sub-pixels P1, of a first sub-pixel P1 located in the first row and a second column is located on a second side of the first sub-region PD1 in the pixel region PD corresponding to the pixel circuit of the first sub-pixel P1 located in the first row and the second column; a second sub-region PD2 in a pixel region PD corresponding to a pixel circuit, among the pixel circuits of the four first sub-pixels P1, of a first sub-pixel P1 located in the second row and the second column is located on a second side of the first sub-region PD1 in the pixel region PD corresponding to the pixel circuit of the first sub-pixel P1 located in the second row and the second column. That is, in the first repeating unit RP1, four first sub-regions PD1 are located between four second sub-regions PD2 in the first direction X.

For example, as shown in FIG. 4B, in the second repeating unit RP2, a second sub-region PD2 in a pixel region PD corresponding to a pixel circuit, among the pixel circuits of the four second sub-pixels P2, of a second sub-pixel P2 located in a first row and a first column is located on a second side of the first sub-region PD1 in the pixel region PD corresponding to the pixel circuit of the second sub-pixel P2 located in the first row and the first column; a second sub-region PD2 in a pixel region PD corresponding to a pixel circuit, among the pixel circuits of the four second sub-pixels P2, of a second sub-pixel P2 located in a second row and the first column is located on a second side of a first sub-region PD1 in the pixel region PD corresponding to the pixel circuit of the second sub-pixel P2 located in the second row and the first column; a second sub-area PD2 in a pixel region PD corresponding to a pixel circuit, among the pixel circuits of the four second sub-pixels P2, of a second sub-pixel P2 located in the first row and a second column is located on a first side of a first sub-region PD1 in the pixel region PD corresponding to the pixel circuit of the second sub-pixel P2 located in the first row and the second column; a second sub-region PD2 in a pixel region PD corresponding to a pixel circuit, among the pixel circuits of the four second sub-pixels P2, of a second sub-pixel P2 located in the second row and the second column is located on a first side of a first sub-region PD1 in the pixel region PD corresponding to the pixel circuit of the second sub-pixel P2 located in the second row and the second column. That is, in the second repeating unit RP2, four second sub-regions PD2 are located between four first sub-regions PD1 in the first direction X.

For example, as shown in FIGS. 4C and 4D, on the base substrate 300, in the first direction X, the plurality of first repeating units RP1 are arranged at intervals, and the plurality of second repeating units RP2 are also arranged at intervals; in the second direction Y, the plurality of first repeating units RP1 are arranged at intervals, and the plurality of second repeating units RP2 are also arranged at intervals; that is, in the first direction X, there is one second repeating unit RP2 between any two adjacent first repeating units RP1, and there is one first repeating unit RP1 between any two adjacent second repeating units RP2; similarly, in the second direction Y, there is one second repeating unit RP2 between any two adjacent first repeating units RP1 and there is one first repeating unit RP1 between any two adjacent second repeating units RP2.

For example, the plurality of first repeating units RP1 and the plurality of second repeating units RP2 constitute a plurality of repeating unit groups, and each repeating unit group in the plurality of repeating unit groups includes two first repeating units RP1 and two second repeating units RP2, that is, two first repeating units RP1 and two second repeating units RP2 constitute a repeating unit group, that is, each repeating unit group includes 16 pixel regions, and FIG. 4C shows a repeating unit group. As shown in FIG. 4D, on the base substrate, the plurality of repeating unit groups are arranged in an array. In each repeating unit group, two first repeating units RP1 and two second repeating units RP2 are arranged in two rows and two columns. In the example shown in FIG. 4C, two first repeating units RP1 are located in the first row and second column and the second row and first column, respectively, and two second repeating units RP2 are located in the first column and second column and the second row and first column, respectively. It should be noted that the embodiments of the present disclosure are not limited to this case, in other embodiments, two first repeating units RP1 are respectively located in the first row and first column and the second row and second column, and two second repeating units RP2 are respectively located in the first row and second column and the second row and first column.

For example, in the first repeating unit RP1 and the second repeating unit RP2, the first sub-pixel P1 located in the first row and the first column among the four first sub-pixels P1 and the second sub-pixel P2 located in the first row and the first column among the four second sub-pixels P2 are red sub-pixels; the first sub-pixel P1 located in the second row and the first column among the four first sub-pixels P1 and the second sub-pixel P2 located in the second row and the first column among the four second sub-pixels P2 are blue sub-pixels; the first sub-pixel P1 located in the first row and the second column among the four first sub-pixels P1, the first sub-pixel P1 located in the second row and the second column among the four first sub-pixels P1, the second sub-pixel P2 located in the first row and the second column among the four second sub-pixels P2, and the second sub-pixel P2 located in the second row and the second column among the four second sub-pixels P2 are green sub-pixels.

It should be noted that although the shape of the pixel region PD, the shape of the first sub-region PD1, and the shape of the second sub-region PD2 shown in FIGS. 4A to 4D are all regular rectangles, in the actual layout, the shape of the pixel region PD, the shape of the first sub-region PD1, and the shape of the second sub-region PD2 are irregular, and the first sub-region PD1 and the second sub-region PD2 may have overlapping parts or may be spaced apart from each other.

For example, the third display region 30 includes a plurality of pixel regions that are in one-to-one correspondence to the pixel circuits of the plurality of third sub-pixels, and the area of the pixel region corresponding to the pixel circuit of the third sub-pixel P3 is smaller than the area of the pixel region PD corresponding to the pixel circuit of the first sub-pixel P1/second sub-pixel P2, for example, the area of the pixel region corresponding to the pixel circuit of the third sub-pixel P3 is half of the area of the pixel region PD corresponding to the pixel circuit of the first sub-pixel P1/second sub-pixel P2.

For example, as shown in FIG. 4C and FIG. 4D, the display substrate is also provided with a plurality of data lines, for example, the plurality of data lines include a first data line Vd1 to an eighth data line Vd8. A data line overlapping with the first sub-region PD1 in the pixel region PD is electrically connected to the pixel circuit in the pixel region PD to provide a data voltage. That is, as shown in FIG. 4C, in the second repeating unit RP2, the first data line Vd1 is electrically connected to the pixel circuit of the second sub-pixel located in the first row and the first column and the pixel circuit of the second sub-pixel located in the second row and the first column, and the fourth data line Vd4 is electrically connected to the pixel circuit of the second sub-pixel located in the first row and the second column and the pixel circuit of the second sub-pixel located in the second row and the second column. In the first repeating unit RP1, the sixth data line Vd6 is electrically connected to the pixel circuit of the first sub-pixel located in the first row and the third column and the pixel circuit of the first sub-pixel located in the second row and the third column, and the seventh data line Vd7 is electrically connected to the pixel circuit of the first sub-pixel located in the first row and the fourth column and the pixel circuit of the first sub-pixel located in the second row and the fourth column. In addition, similarly, the fifth data line Vd5 is electrically connected to the pixel circuit of the second sub-pixel located in the third row and the third column and the pixel circuit of the second sub-pixel located in the fourth row and the third column, and the eighth data line Vd8 is electrically connected to the pixel circuit of the second sub-pixel located in the third row and the fourth column and the pixel circuit of the second sub-pixel located in the fourth row and the fourth column; the second data line Vd2 is electrically connected to the pixel circuit of the first sub-pixel located in the third row and the first column and the pixel circuit of the first sub-pixel located in the fourth row and the first column, and the third data line Vd3 is electrically connected to the pixel circuit of the first sub-pixel located in the third row and the second column and the pixel circuit of the first sub-pixel located in the fourth row and the second column.

For example, as shown in FIG. 4C, the first data line Vd1 to the eighth data line Vd8 extend along the second direction Y, the first data line VD1, the fourth data line Vd4, the fifth data line Vd5, and the eighth data line Vd8 extend from bottom to top, and the second data line Vd2, the third data line Vd3, the sixth data line Vd6, and the seventh data line Vd7 extend from top to bottom.

For example, as shown in FIG. 4D, the data line connected to the first sub-pixel passes through the first display region, then passes through the peripheral region, and finally extends to the pixel region corresponding to the pixel circuit of the first sub-pixel. Taking the second data line Vd2 and the third data line Vd3 as an example, the light-emitting element of the first sub-pixel connected to the second data line Vd2 and the light-emitting element of the first sub-pixel connected to the third data line Vd3 are located in the first display region 10, for example, the pixel circuit located in the third row and the first column is used to drive the light-emitting element 201 located in the first display region 10 to emit light, and the pixel circuit located in the third row and the second column is used to drive the light-emitting element 202 located in the first display region 10 to emit light. The pixel circuit located in the third row and the first column is electrically connected to the corresponding light-emitting element 201 through a connection line CL1, thereby driving the corresponding light-emitting element 201 to emit light; the pixel circuit located in the third row and the second column is electrically connected to the corresponding light-emitting element 202 through a connection line CL2, thereby driving the corresponding light-emitting element 202 to emit light. For example, the second data line Vd2 passes through the first display region 10, then passes through the peripheral region, and finally extends to the pixel region of the pixel circuit located in the third row and the first column; and the third data line Vd3 passes through the first display region 10, then passes through the peripheral region, and finally extends to the pixel region of the pixel circuit located in the third row and the second column.

It should be noted that in the embodiments of the present disclosure, the pixel circuit of the first sub-pixel is located in the second display region 20 (i.e., the non-camera region), while the light-emitting element of the first sub-pixel is located in the first display region 10 (i.e., the camera region), because the arrangement order of the data lines (Vd1~Vd8) in the first display region and the second display region from left to right (i.e., the first direction X) is the non-camera region (for example, the left part of the second display region 20 shown in FIG. 4D)—the camera region (e.g., the first display region 10 shown in FIG. 4D, i.e., the middle part)—the non-camera region (e.g., the right part of the second display region 20 shown in FIG. 4D) in turn, therefore, the data lines belonging to the camera region (i.e., the data lines corresponding to the first sub-pixels, for example, the data line Vd2, the data line Vd3, the data line Vd6, the data line Vd7, etc.) can only extend along the second direction Y from the lower part corresponding to the camera region shown in FIG. 4D and be introduced into the camera region. After passing through the camera region, the data lines belonging to the camera region can be wound from the peripheral region (the upper part shown in FIG. 4D) and then introduced into the pixel circuits of the first sub-pixels located in the non-camera region. The rest data lines belonging to the non-camera region (i.e. the data lines corresponding to the second sub-pixels, such as the data line Vd1, the data line Vd4, the data line Vd5, and the data line Vd8, etc.) can extend along the second direction Y from the lower part corresponding to the non-camera region shown in FIG. 4D and be directly introduced into the pixel circuits of the second sub-pixels located in the non-camera region.

Table 1 below shows the simulated currents of the conventional 7T1C pixel circuit (for example, the elements other than the second driving transistor T12, the third light-emitting control transistor T22, and the fourth light-emitting control transistor T32 in the pixel circuit shown in FIG. 2) and the simulated currents of the pixel circuit shown in FIG. 2 of the present disclosure.

TABLE 1

|  |  | $V_{N1}$ | $V_{N2}$ | $V_{N3}$ | $V_{N4}$ | Ioled | Current difference |
|---|---|---|---|---|---|---|---|
| Conventional 7T1C pixel circuit | R | 0.634 | 4.593 | 1.809 | 1.799 | 76.23 |  |
|  | G1 | 1.053 | 4.597 | 1.191 | 1.186 | 34.56 |  |
|  | B | 0.324 | 4.588 | 1.443 | 1.424 | 127 |  |
|  | G2 | 1.053 | 4.597 | 1.191 | 1.186 | 34.57 |  |
| The pixel circuit shown in FIG. 2 | R | 0.509 | 4.592 | 3.068 | 3.058 | 174.59 | 229% |
|  | G1 | 0.877 | 4.596 | 2.458 | 2.452 | 95.772 | 227.1% |
|  | B | 0.155 | 4.595 | 1.953 | 1.932 | 320.28 | 252.2% |
|  | G2 | 0.877 | 4.596 | 2.458 | 2.452 | 95.787 | 277.1% |

As shown in Table 1, referring to FIGS. 4A and 4B, the R sub-pixel may represent the first sub-pixel located in the first row and the first column in the first repeating unit or the second sub-pixel located in the first row and the first column in the second repeating unit, the B sub-pixel may represent the first sub-pixel located in the second row and the first column in the first repeating unit or the second sub-pixel located in the second row and the first column in the second repeating unit, the G1 sub-pixel may represent the first sub-pixel located in the first row and the second column in the first repeating unit or the second sub-pixel located in the first row and the second column in the second repeating unit, and the G2 sub-pixel may represent the first sub-pixel located in the second row and the second column in the first repeating unit or the second sub-pixel located in the second row and the second column in the second repeating unit.

For example, Ioled represents a driving current flowing through the light-emitting element 200. $V_{N1}$ represents a voltage of the N1 node, $V_{N2}$ represents a voltage of the N2 node, $V_{N3}$ represents a voltage of the N3 node, and $V_{N4}$ represents a voltage of the N4 node. In Table 1, the unit of voltage is volts (V).

As shown in Table 1, in the actual simulation, based on the conventional 7T1C pixel circuit, the driving current of the R sub-pixel is 76.23 mA, the driving current of the G1 sub-pixel is 34.56 mA, the driving current of the B sub-pixel is 127 mA, and the driving current of the G2 sub-pixel is 34.57 mA; based on the pixel circuit shown in FIG. 2, the driving current of the R sub-pixel is 174.59 mA, the driving current of the G1 sub-pixel is 95.772 mA, the driving current of the B sub-pixel is 320.28 mA and the driving current of the G2 sub-pixel is 95.787 mA. That is, the current difference of the driving current of the R sub-pixel is 229%, that is, for the R sub-pixel, the driving current obtained based on the pixel circuit shown in FIG. 2 is 2.29 times the driving current obtained based on the conventional 7T1C pixel circuit; the current difference of the driving current of the G1 sub-pixel is 227.1%, that is, for the G1 sub-pixel, the driving current obtained based on the pixel circuit shown in FIG. 2 is 2.271 times the driving current obtained based on the conventional 7T1C pixel circuit; the current difference of the driving current of the B sub-pixel is 252.2%, that is, for the B sub-pixel, the driving current obtained based on the pixel circuit shown in FIG. 2 is 2.522 times the driving current obtained based on the conventional 7T1C pixel circuit; the current difference of the driving current of the G2 sub-pixel is 227.1%, that is, for the G2 sub-pixel, the driving current obtained based on the pixel circuit shown in FIG. 2 is 2.271 times the driving current obtained based on the conventional 7T1C pixel circuit.

It should be noted that in this simulation, the current difference is more than twice. In fact, in different simulations, the current differences are not the same, and the cases where the current differences are more than one time and more than two times, etc. all meet the expected requirements.

FIGS. 5A to 5E are schematic structural diagrams of functional layers of a pixel circuit provided by some embodiments of the present disclosure. Next, the positional relationship of the respective elements in the pixel circuit on the backplane will be described with reference to FIGS. 5A-5E, and the examples shown in FIGS. 5A-5E take the pixel circuit 100 shown in FIG. 2 as an example.

Figure 5A:
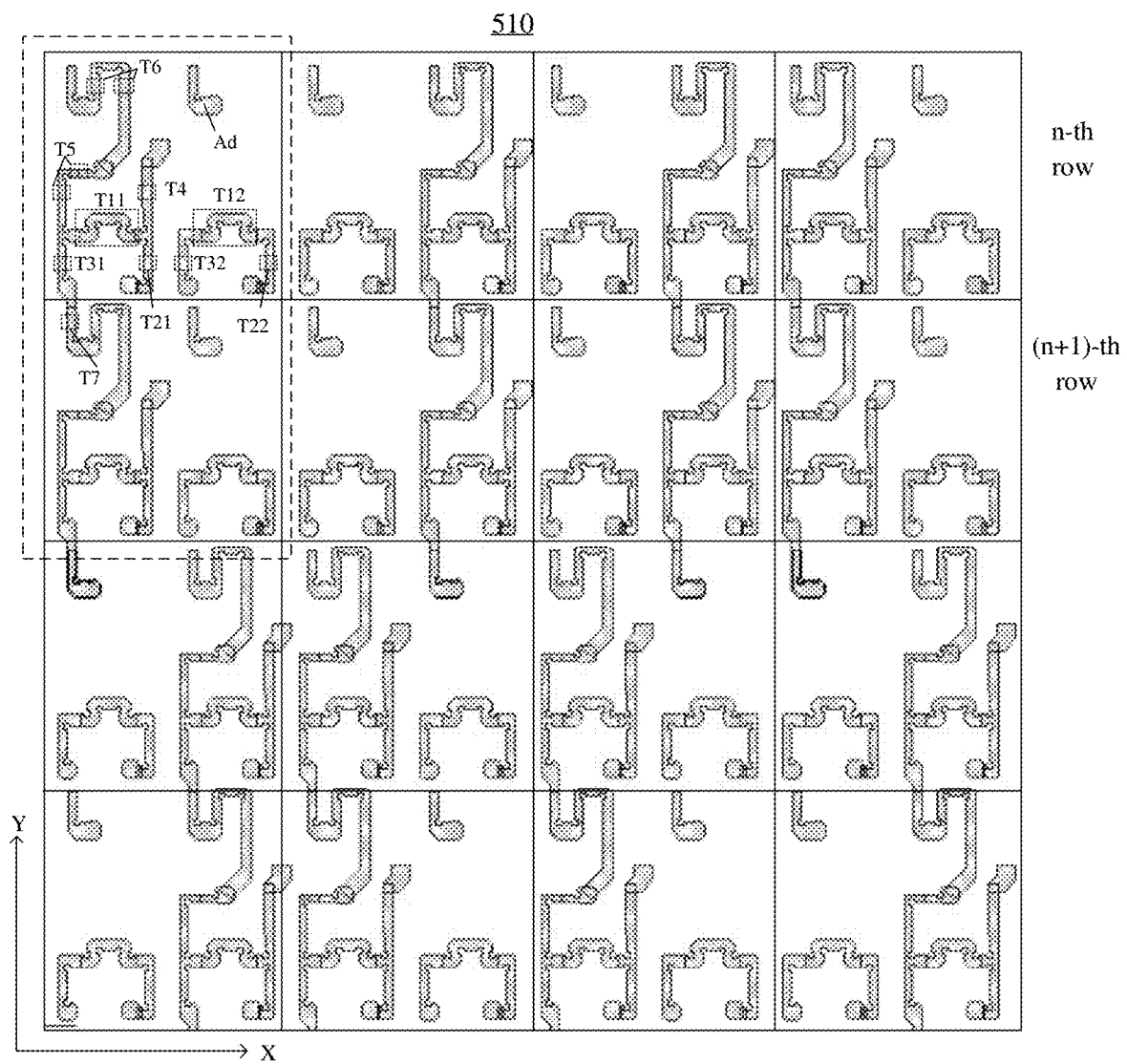
FIGS. 5A to 5E are schematic structural diagrams of respective functional layers of a pixel circuit provided by some embodiments of the present disclosure.
Figure 5B:
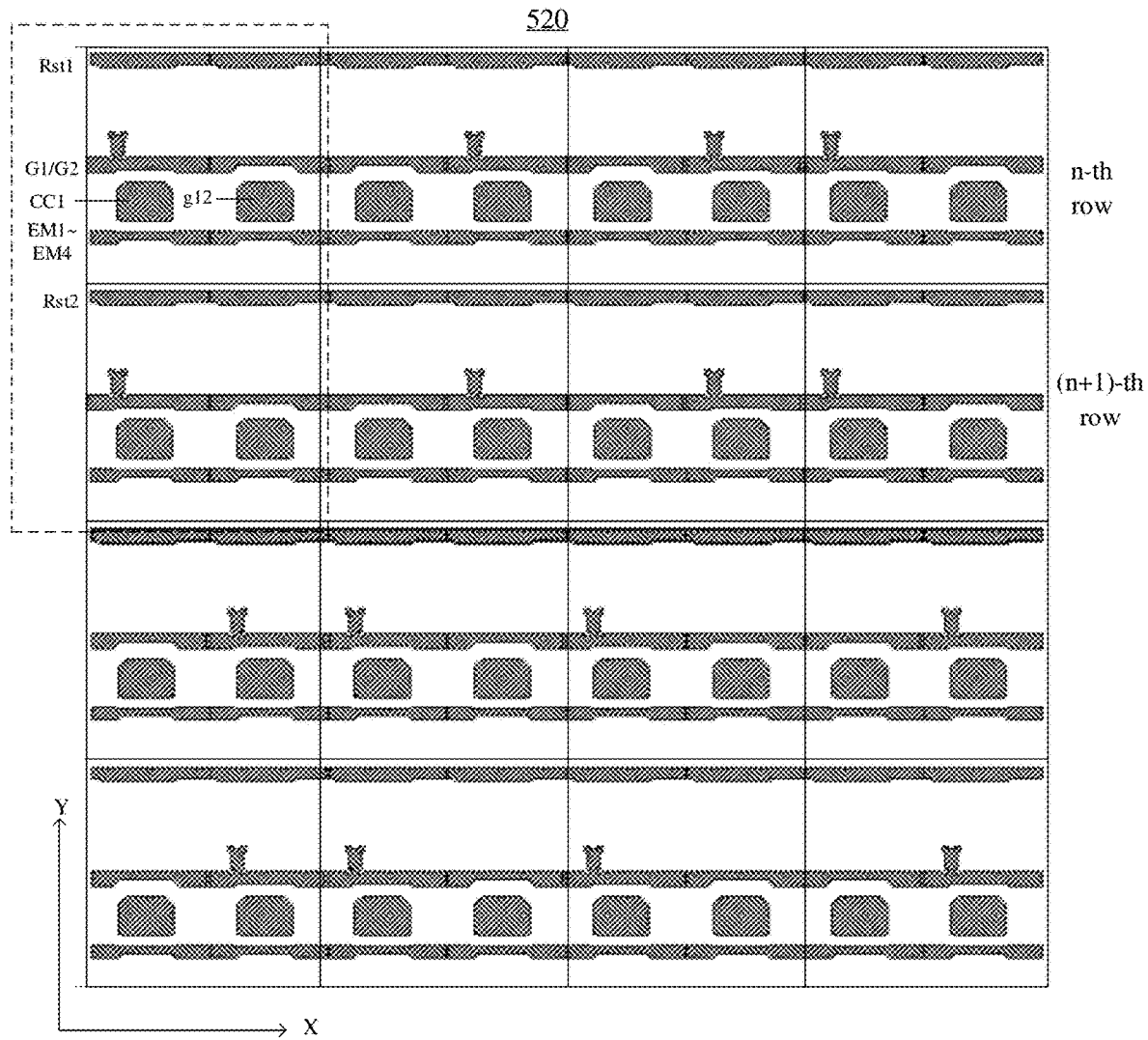
Figure 5C:
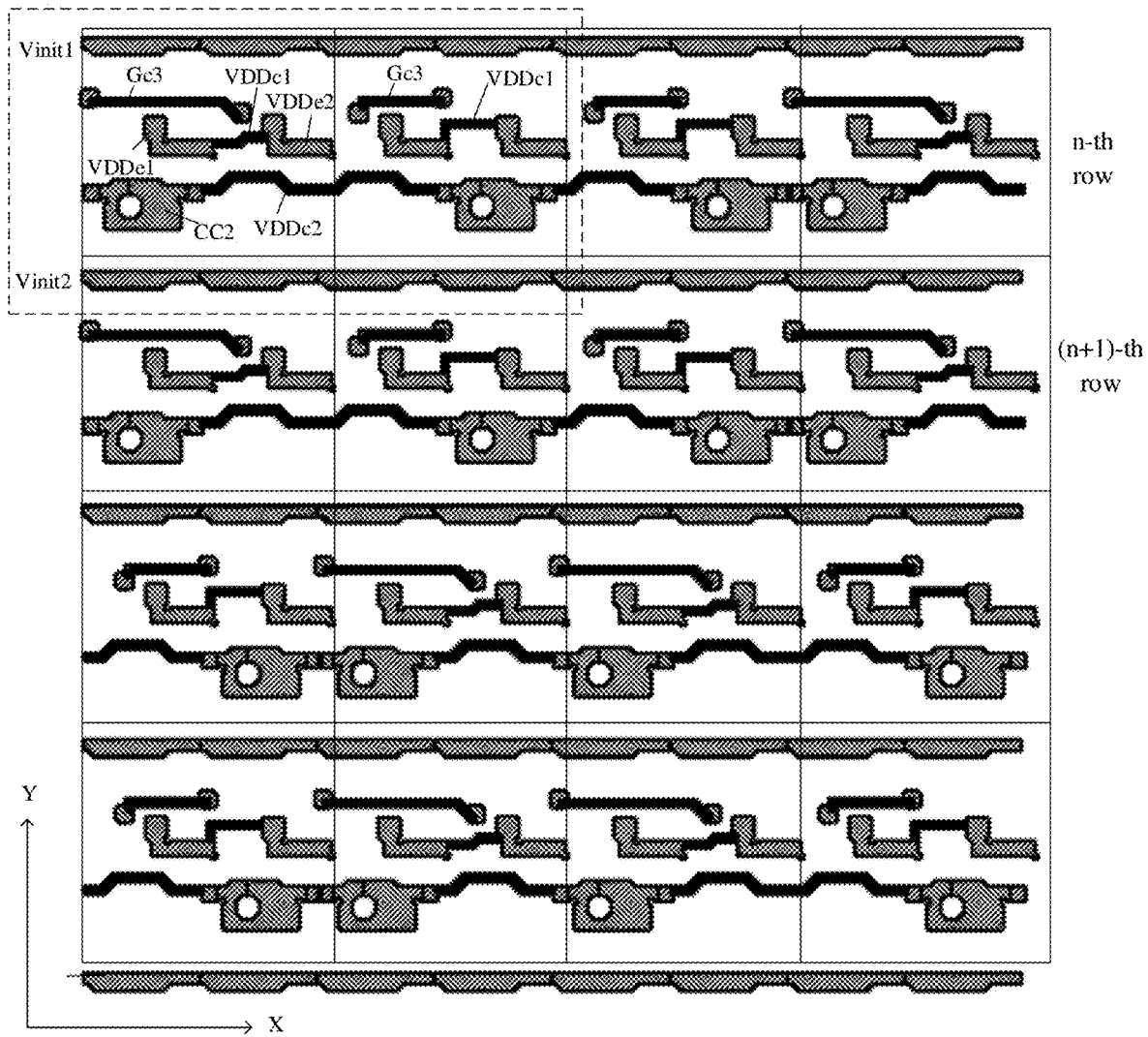
Figure 5D:
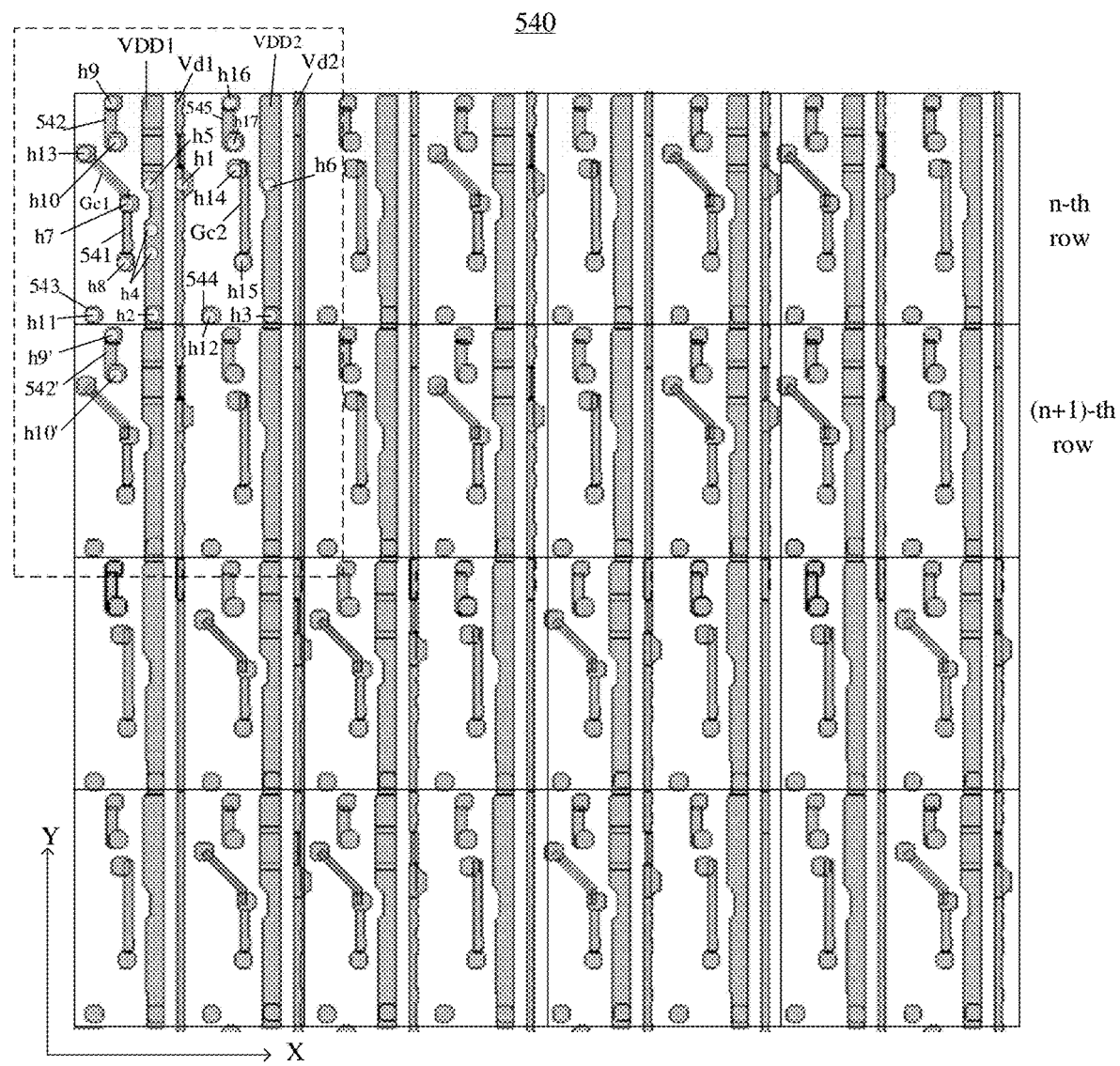
Figure 5E:
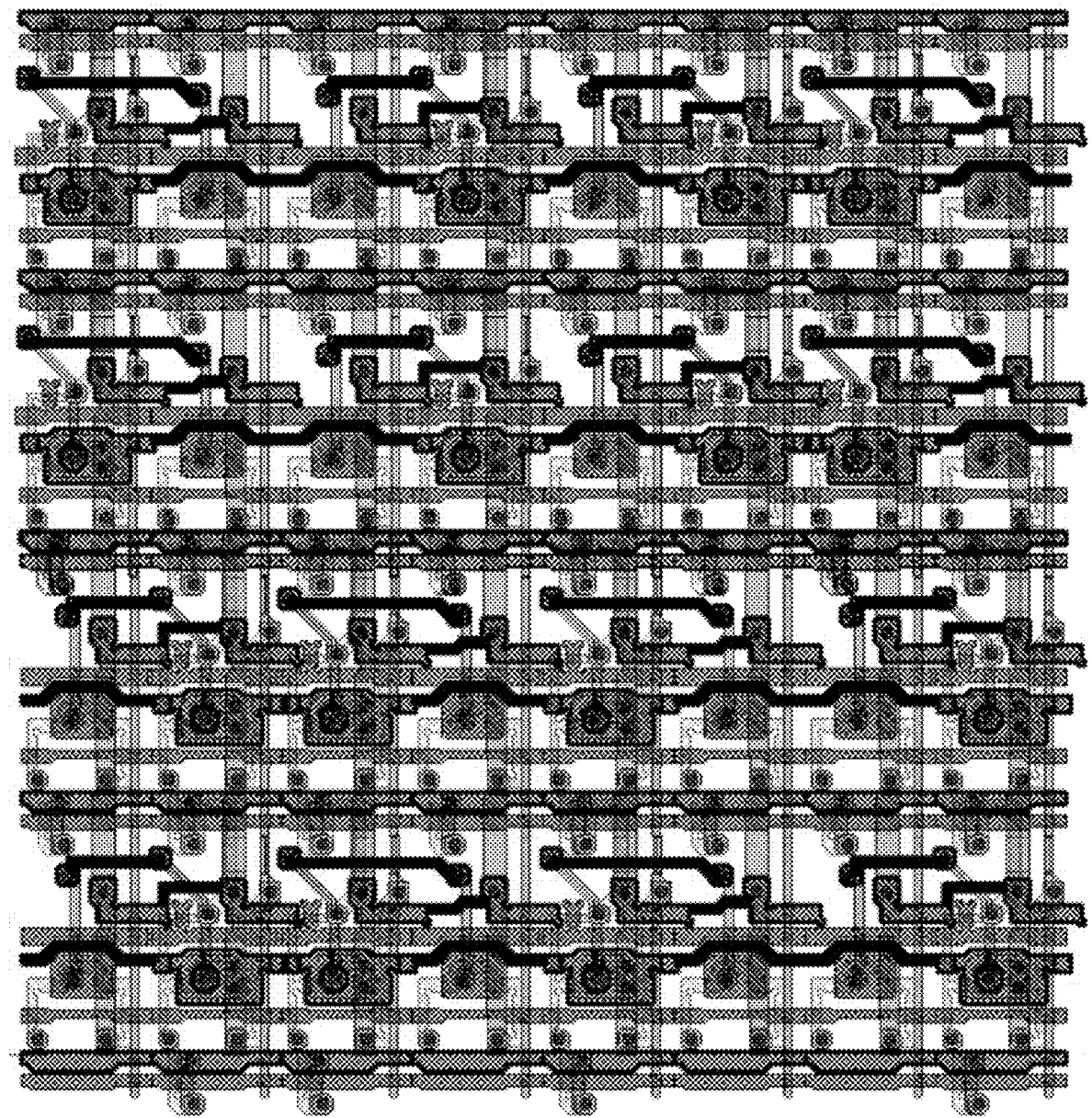

For example, as shown in FIGS. 5A to 5E, the pixel circuit 100 has an active semiconductor layer 510, a first functional layer 540, a second functional layer 530, and a third functional layer 520, and FIG. 5E is a schematic diagram of the stacked positional relationship of the active semiconductor layer 510, the first functional layer 540, the second functional layer 530, and the third functional layer 520. Next, the structures of the active semiconductor layer 510, the first functional layer 540, the second functional layer 530, and the third functional layer 520 will be described in detail with reference to FIGS. 5A to 5E. For example, each layer structure shown in FIGS. 5A-5E corresponds to 16 sub-pixels in one repeating unit group.

As shown in FIG. 2, the pixel circuit 100 includes a first driving transistor T11, a second driving transistor T12, a first light-emitting control transistor T21, a second light-emitting control transistor T31, a third light-emitting control transistor T22, a fourth light-emitting control transistor T32, a data writing transistor T4, a storage capacitor C, a threshold compensation transistor T5, a first initialization transistor T6, and a second initialization transistor T7 shown in FIG. 2. FIGS. 5A to 5E also show the first scan line G1, the second scan line G1, the first power line VDD1, the second power line VDD2, the power connection line VDDc1, the first light-emitting control signal line EM1 to the fourth light-emitting control signal line EM4, the first initialization voltage line Vinit1, the second initialization voltage line Vinit2, the first initialization control signal line Rst1, the second initialization control signal line Rst2, the data line Vd, and the like that are connected to the pixel circuit 100.

It should be noted that in the examples shown in FIGS. 5A to 5E, the first scan line G1 and the second scan line G2 are the same signal line, and the first light-emitting control signal line EM1 to the fourth light-emitting control signal line EM4 are the same signal line. For example, the first initialization control signal line Rst1 and the second initialization control signal line Rst2 are different signal lines, the first initialization control signal line Rst1 is connected to the first initialization circuit in the pixel circuit of the sub-pixel located in the n-th row and the second initialization circuit in the pixel circuit of the sub-pixel located in the (n−1)-th row (not shown in the figure), and the second initialization control signal line Rst2 is connected to the second initialization circuit in the pixel circuit of the sub-pixel located in the n-th row and the first initialization circuit in the pixel circuit of the sub-pixel located in the (n+1)-th row. Similarly, the first initialization voltage line Vinit1 and the second initialization voltage line Vinit2 are different signal lines, the first initialization voltage line Vinit1 is connected to the first initialization circuit in the pixel circuit of the sub-pixel located in the n-th row and the second initialization circuit in the pixel circuit of the sub-pixel located in the (n−1)-th row, and the second initialization voltage line Vinit2 is connected to the second initialization circuit in the pixel circuit of the sub-pixel located in the n-th row and the first initialization circuit in the pixel circuit of the sub-pixel located in the (n+1)-th row.

For example, in FIGS. 5A to 5D, the part represented by each rectangular box is a pixel region corresponding to one pixel circuit 100.

Figure 6A:
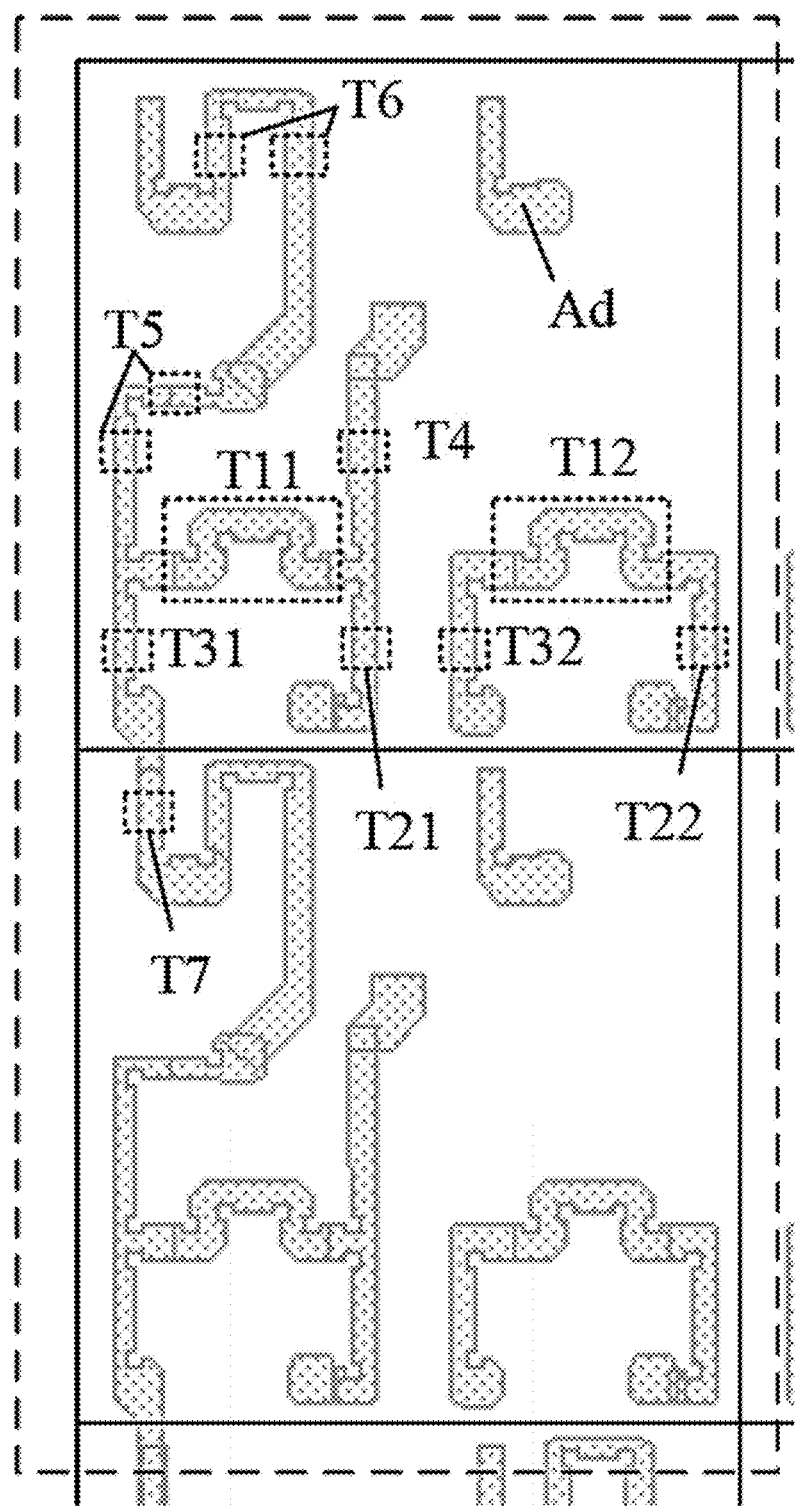
FIGS. 6A to 6D are enlarged schematic diagrams of respective functional layers of a pixel circuit provided by some embodiments of the present disclosure.

For example, FIG. 5A shows the active semiconductor layer 510 of the pixel circuit 100, and FIG. 6A is an enlarged schematic diagram of the rectangular dashed box in FIG. 5A. The active semiconductor layer 510 may be patterned on the base substrate using a semiconductor material. The active semiconductor layer 510 can be used to fabricate the active layer of the first driving transistor T11, the active layer of the second driving transistor T12, the active layer of the first light-emitting control transistor T21, the active layer of the second light-emitting control transistor T31, the active layer of the third light-emitting control transistor T22, the active layer of the fourth light-emitting control transistor T32, the active layer of the data writing transistor T4, the active layer of the threshold compensation transistor T5, the active layer of the first initialization transistor T6, and the active layer of the second initialization transistor T7, and each active layer can include a source region, a drain region, and a channel region between the source region and the drain region. For example, the active layer of the first driving transistor T11, the active layer of the first light-emitting control transistor T21, the active layer of the second light-emitting control transistor T31, the active layer of the data writing transistor T4, the active layer of the threshold compensation transistor T5, the active layer of the first initialization transistor T6, and the active layer of the second initialization transistor T7 are integrally provided, and the active layer of the second driving transistor T12, the active layer of the third light-emitting control transistor T22, and the active layer of the fourth light-emitting control transistor T32 are integrally provided. However, the channel region of each transistor may become conductive or return to non-conductive due to the scan signal on the corresponding gate electrode, but the parts between the active layers of the respective transistors will not become conductive because they are not affected by the scan signal, so that the integral arrangement of the active layers will not cause crosstalk between the respective transistors.

It should be noted that for the second initialization transistor T7, in the examples shown in FIGS. 5A and 6A, the second initialization transistor T7 shares the initialization voltage line and the initialization control signal line with the first initialization transistor in the pixel circuit in the next row adjacent to the row where the second initialization transistor T7 is located. Therefore, on the layout, the second initialization transistor T7 of the pixel circuit of the sub-pixel located in the n-th row is located in the pixel region corresponding to pixel circuit of the sub-pixel in the (n+1)-th row.

For example, the shape of the active layer of the first driving transistor T11 and the shape of the active layer of the second driving transistor T12 may be the same, and the relative positional relationship among the active layer of the first driving transistor T11, the active layer of the first light-emitting control transistor T21, and the active layer of the second light-emitting control transistor T31 is the same as the relative positional relationship among the active layer of the second driving transistor T12, the active layer of the third light-emitting control transistor T22, and the active layer of the fourth light-emitting control transistor T32.

For example, the active semiconductor layer 510 can be made of amorphous silicon, polysilicon, oxide semiconductor materials, etc., It should be noted that the source region and the drain region mentioned above may be regions doped with N-type impurities or P-type impurities. In the embodiment of the present disclosure, the doped source region corresponds to the source electrode of the transistor (for example, the first electrode of the transistor), and the doped drain region corresponds to the drain electrode of the transistor (for example, the second electrode of the transistor).

For example, as shown in FIGS. 5A and 6A, in the second direction Y, the active layer of the data writing transistor T4, the active layer of the threshold compensation transistor T5, the active layer of the first initialization transistor T6, and the active layer of the second initialization transistor T7 are located on a first side, for example, an upper side, of the active layer of the first driving transistor T11; the active layer of the first light-emitting control transistor T21 and the active layer of the second light-emitting control transistor T31 are located on a second side, for example, a lower side, of the active layer of the first driving transistor T11. The first side and the second side of the active layer of the first driving transistor T11 are opposite sides of the active layer of the first driving transistor T11 in the second direction Y. The active layer of the third light-emitting control transistor T22 and the active layer of the fourth light-emitting control transistor T32 are located on a lower side of the active layer of the second driving transistor T12, for example.

It should be noted that, as shown in FIGS. 5A and 6A, the active semiconductor layer 510 has a partial region Ad, the partial region Ad is not used to form the active layer of the transistor, but is set to improve the etching uniformity of the first sub-region and the second sub-region in the pixel region. The shape of the partial region Ad is not limited to the shape shown in the figure, for example, the partial region Ad may also include a plurality of disconnected portions.

Figure 6B:
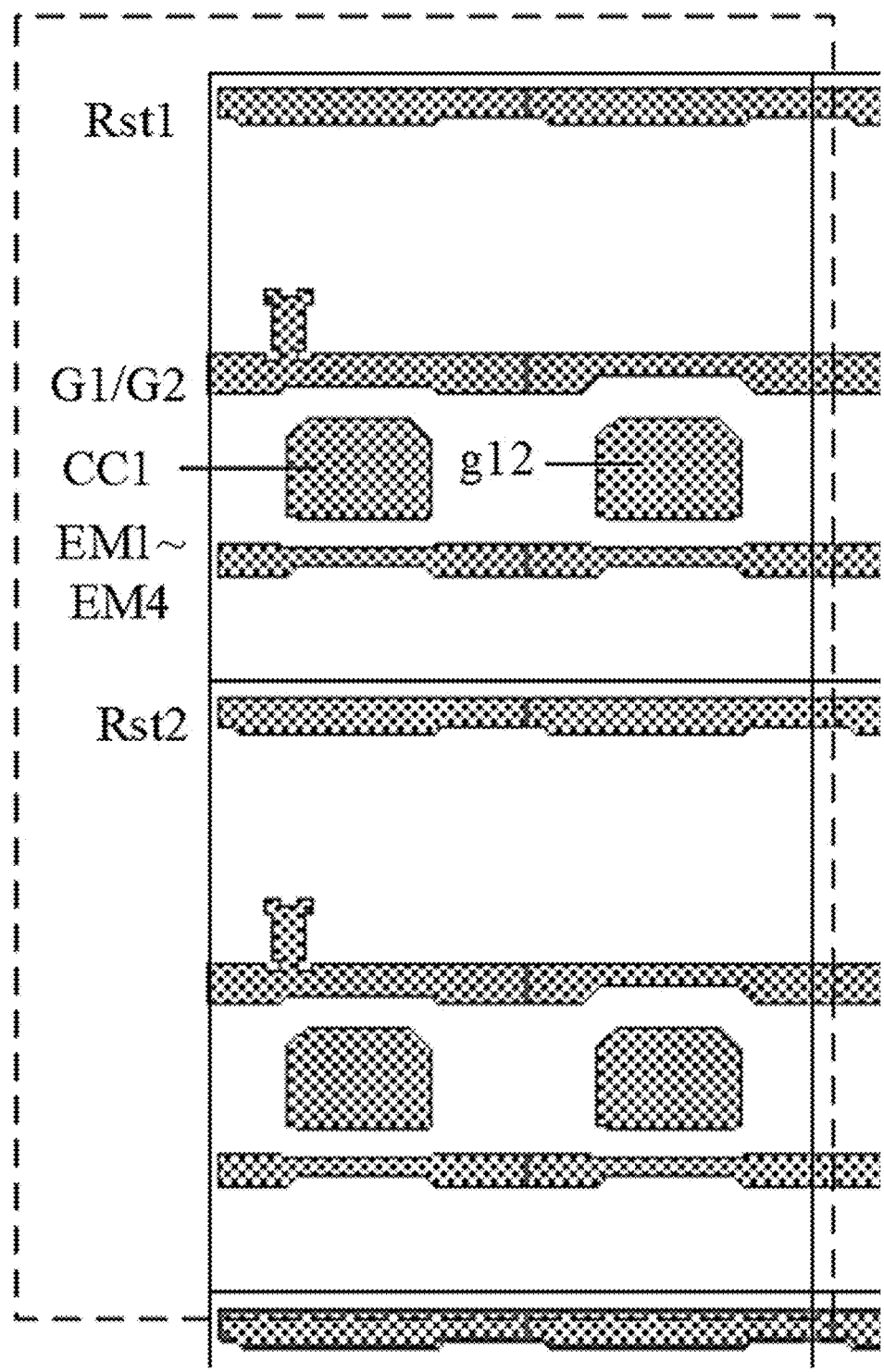

For example, a gate insulating layer (not shown) is formed on the active semiconductor layer 510 to protect the above-mentioned active semiconductor layer 510. FIG. 5B shows the third functional layer 520 (for example, the first gate metal layer) of the pixel circuit 100, the third functional layer 520 is disposed on the gate insulating layer so as to be insulated from the active semiconductor layer 510. FIG. 6B is an enlarged schematic diagram of the rectangular dashed box in FIG. 5B.

For example, the third functional layer 520 may include the first electrode CC1 of the storage capacitor C, the first scan line G1, the second scan line G2, the first initialization control signal line Rst1, the second initialization control signal line Rst2, the first light-emitting control signal line EM1 to the fourth light-emitting control signal line EM4, the gate electrode of the first driving transistor T11, the gate electrode of the second driving transistor T12, the gate electrode of the first light-emitting control transistor T21, the gate electrode of the second light-emitting control transistor T31, the gate electrode of the third light-emitting control transistor T22, the gate electrode of the fourth light-emitting control transistor T32, the gate electrode of the data writing transistor T4, the gate electrode of the threshold compensation transistor T5, the gate electrode of the first initialization transistor T6, and the gate electrode of the second initialization transistor T7. For example, the first electrode CC1 of the storage capacitor C is multiplexed as the gate electrode of the first driving transistor T11, and the gate electrode of the second driving transistor T12 is denoted as g12 in FIGS. 5B and 6B. It should be noted that the storage capacitor C is only located in the first sub-region of the pixel region corresponding to the pixel circuit to which the storage capacitor C belongs.

For example, as shown in FIGS. 5B and 6B, the gate electrode of the data writing transistor T4 may be a portion of the first scan line G1 overlapping with the active semiconductor layer 510. The threshold compensation transistor T5 may be a double-gate thin film transistor, the first gate electrode of the threshold compensation transistor T5 may be a portion of the second scan line G2 overlapping with the active semiconductor layer 510, and the second gate electrode of the threshold compensation transistor T5 may be a portion of a protrusion protruding from the second scan line G2 overlapping with the active semiconductor layer 510. For example, the first scan line G1 and the second scan line G2 are the same signal line, that is, the first scan line G1 (that is, the second scan line G2) and the active semiconductor layer 510 have three overlapping portions.

For example, the gate electrode of the first light-emitting control transistor T21 may be a first portion of the first light-emitting control signal line EM1 overlapping with the active semiconductor layer 310, the gate electrode of the second light-emitting control transistor T31 may be a second portion of the first light-emitting control signal line EM1 overlapping with the active semiconductor layer 310, the gate electrode of the third light-emitting control transistor T22 may be a third portion of the first light-emitting control signal line EM1 overlapping with the active semiconductor layer 310, and the gate electrode of the fourth light-emitting control transistor T32 may be a fourth portion of the first light-emitting control signal line EM1 overlapping with the active semiconductor layer 310. As shown in FIGS. 5A and 6A, the first portion, the second portion, the third portion, and the fourth portion of the first light-emitting control signal line EM1 overlapping with the active semiconductor layer 310 are sequentially arranged along the first direction X.

For example, the first initialization transistor T6 can also be a double-gate thin film transistor. The two gate electrodes of the first initialization transistor T6 are respectively a first portion and a second portion of the first initialization control signal line Rst1 overlapping with the active semiconductor layer 510, and the gate electrode of the second initialization transistor T7 is a third portion of the first initialization control signal line Rst1 overlapping with the active semiconductor layer 310. As shown in FIGS. 5A and 6A, the first portion, the second portion, and the third portion of the first initialization control signal line Rst1 overlapping with the active semiconductor layer 310 are sequentially arranged along the first direction X.

It should be noted that the respective rectangular dashed boxes in FIGS. 5A and 6A shows the respective portions where the third functional layer 520 overlaps with the active semiconductor layer 510 in the direction perpendicular to the base substrate.

For example, as shown in FIGS. 5B and 6B, the first scan line G1/second scan line G2, the first initialization control signal line Rst1, the second initialization control signal line Rst2, and the first light-emitting control signal line EM1 to the fourth light-emitting control signal line EM4 extend substantially along the first direction X and are arranged along the second direction Y. The first scan line G1/second scan line G2 is located between the first initialization control signal line Rst1 and the first light-emitting control signal line EM1 to the fourth light-emitting control signal line EM4, and the first light-emitting control signal line EM1 to the fourth light-emitting control signal line EM4 are located between the first scan line G1/second scan line G2 and the second initialization control signal line Rst2.

For example, in the first direction X, the first electrode CC1 of the storage capacitor C is located between the first scan line G1/second scan line G2 and the first light-emitting control signal line EM1 to the fourth light-emitting control signal line EM4. The protrusion protruding from the second scan line G2 is located on the side of the second scan line G2 away from the first light-emitting control signal line EM1 to the fourth light-emitting control signal line EM4.

For example, as shown in FIGS. 5A, 6A, 5B, and 6B, in the second direction Y, the gate electrode of the data writing transistor T4, the gate electrode of the threshold compensation transistor T5, the gate electrode of the first initialization transistor T6, and the gate electrode of the second initialization transistor T7 are located on the first side, for example, the upper side, of the gate electrode of the first driving transistor T11; the gate electrode of the first light-emitting control transistor T21 and the gate electrode of the second light-emitting control transistor T31 are located on the second side, for example, the lower side, of the gate electrode of the first driving transistor T11. The first side and the second side of the gate electrode of the first driving transistor T11 are opposite sides of the gate electrode of the first driving transistor T11 in the second direction Y. For example, the gate electrode of the third light-emitting control transistor T22 and the gate electrode of the fourth light-emitting control transistor T32 are located on, for example, the lower side of the gate electrode of the second driving transistor T12.

For example, in some embodiments, as shown in FIGS. 5A and 6A, in the first direction X, the gate electrode of the threshold compensation transistor T5, the gate electrode of the second light-emitting control transistor T31, and the gate electrode of the second initialization transistor T7 are all located on the third side, for example, the left side, of the gate electrode of the first driving transistor T11; the gate electrode of the data writing transistor T4 and the gate electrode of the first light-emitting control transistor T21 are both located on the fourth side, for example, the right side, of the gate electrode of the first driving transistor T11; the third side and the fourth side of the gate electrode of the first driving transistor T11 are opposite sides of the gate electrode of the first driving transistor T11 in the first direction X. The gate electrode of the fourth light-emitting control transistor T32 is located on, for example, the left side of the gate electrode of the second driving transistor T12, and the gate electrode of the third light-emitting control transistor T22 is located on, for example, the right side of the gate electrode of the second driving transistor T12.

Figure 6C:
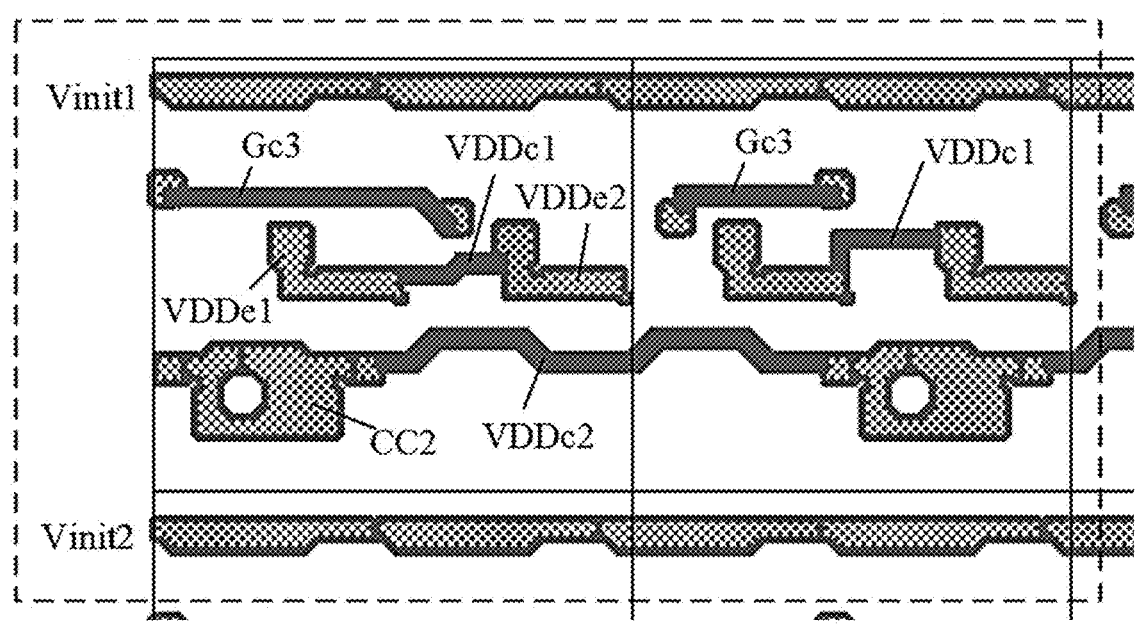

For example, a first insulating layer (not shown) is formed on the third functional layer 520 to protect the above-mentioned third functional layer 520. FIG. 5C shows the second functional layer 530 of the pixel circuit 100. The second functional layer 530 includes the second electrode CC2 of the storage capacitor C, the first initialization voltage line Vinit1, the second initialization voltage line Vinit2, the power connection line VDDc1 (for example, hereinafter referred to as a first power connection line VDDc1), the power connection line VDC2 (for example, hereinafter referred to as a second power connection line VDDc2), and the third gate connection line Gc3. FIG. 6C is an enlarged schematic diagram of the rectangular dashed box in FIG. 5C.

For example, the first power connection line VDDc1 is used to connect the first power line VDD1 and the second power line VDD2. The second power connection line VDDc2 is used to connect the first power lines VDD1 electrically connected to the pixel circuits of two adjacent sub-pixels in the same row, and the second power connection line VDDc2 is integrally formed with the second electrode CC2 of the storage capacitor C. The first power lines VDD1 and the second power lines VDD2 corresponding to the respective pixel circuits are connected by the first power connection lines VDDc1 and the second power connection lines VDDc2, so that all the first power lines VDD1 and the second power lines VDD2 form a network, which is conducive to reducing the power voltage drop (IR drop) and further can improve the stability of the power voltages provided by the first power line VDD1 and the second power line VDD2.

For example, in the direction perpendicular to the base substrate, the first electrode CC1 of the storage capacitor C and the second electrode CC2 of the storage capacitor C at least partially overlap to form the storage capacitor C.

For example, the second electrode CC2 of the storage capacitor C includes a hole, and the second electrode of the threshold compensation transistor T5 is electrically connected to the gate electrode of the first driving transistor T11 through the hole.

For example, as shown in FIGS. 5C and 6C, the second functional layer 530 further includes a first connection electrode block VDDe1 and a second connection electrode block VDDe2, the first connection electrode block VDDe1 is electrically connected to the first power line VDD1, the second connection electrode block VDDe2 is electrically connected to the second power line VDD2, and the first power connection line VDDc1 is used to electrically connect the first connection electrode block VDDe1 to the second connection electrode block VDDe2, thereby electrically connecting the first power line VDD1 to the second power line VDD2.

For example, as shown in FIGS. 5C and 6C, the first initialization voltage line Vinit1, the second initialization voltage line Vinit2, the third gate connection line Gc3, the first power connection line VDDc1, and the second power connection line VDDc2 extend substantially in the first direction X. In the second direction Y, the first power connection line VDDc1 is located between the third gate connection line Gc3 and the second power connection line VDDc2, the third gate connection line Gc3 is located between the first initialization voltage line Vinit1 and the first power connection line VDDc1, and the second power connection line VDDc2 is located between the second initialization voltage line Vinit2 and the first power connection line VDDc1.

Figure 6D:
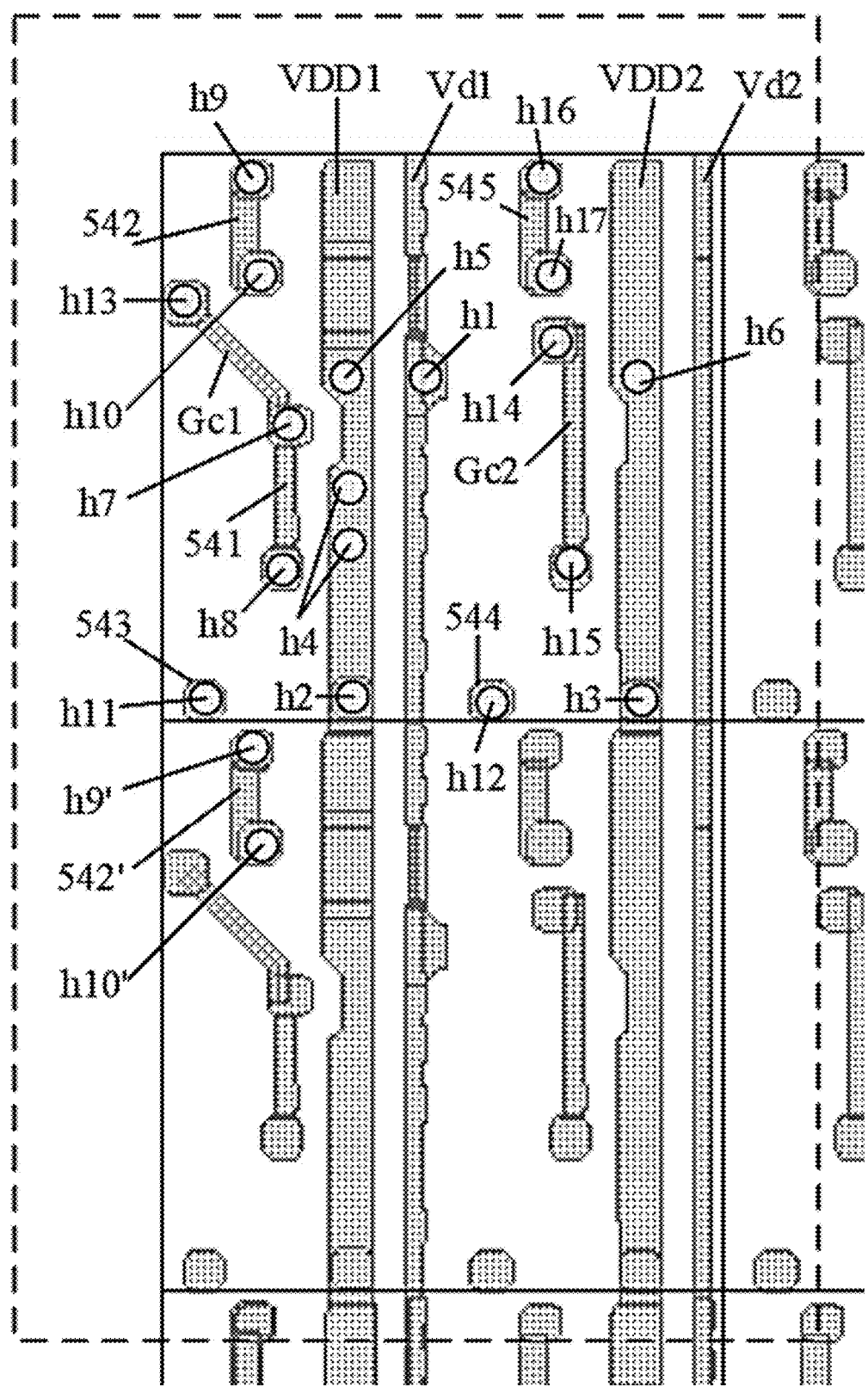

For example, a second insulating layer (not shown) is formed on the second functional layer 530 to protect the above-mentioned second functional layer 530. FIG. 5D shows the first functional layer 540 of the pixel circuit 100. The first functional layer 540 includes the first data line Vd1 to the eighth data line Vd8 (only the first data line Vd1 and the second data line Vd2 are labeled in FIG. 5D), the first power line VDD1, the second power line VDD2, the first gate connection line Gc1, and the second gate connection line Gc2. FIG. 6D is an enlarged schematic diagram of the rectangular dashed box in FIG. 5D.

For example, as shown in FIGS. 5D and 6D, the first data line Vd1, the second data line Vd2, the first power line VDD1, the second power line VDD2, the first gate connection line Gc1, and the second gate connection line Gc2 extend substantially along the second direction Y. In the first direction X, the first power line VDD1 is located between the first gate connection line Gc1 and the first data line Vd1, the first data line Vd1 is located between the first power line VDD1 and the second gate connection line Gc2, the second gate connection line Gc2 is located between the first data line Vd1 and the second power line VDD2, and the second power line VDD2 is located between the second gate connection line Gc2 and the second data line Vd2.

FIG. 5E is a schematic diagram of the stacked positional relationship of the active semiconductor layer 510, the third functional layer 520, the second functional layer 530, and the first functional layer 540. As shown in FIGS. 5D, 6D, and 5E, the first data line Vd1 is connected to the source region of the data writing transistor T4 in the active semiconductor layer 510 through at least one hole (for example, a hole h1) in the gate insulating layer, the first insulating layer, and the second insulating layer.

The first power line VDD1 is connected to the source region of the corresponding first light-emitting control transistor T21 in the active semiconductor layer 310 through at least one hole (for example, a hole h2) in the gate insulating layer, the first insulating layer, and the second insulating layer; the first power line VDD1 is connected to the second electrode CC2 of the storage capacitor in the second functional layer 530 through at least one hole (for example, a hole h4) in the second insulating layer. The first power line VDD1 is also connected to the first connection electrode block VDDe1 in the second conductive layer 330 through at least one hole (for example, a hole h5) in the second insulating layer.

The second power line VDD2 is connected to the source region of the corresponding third light-emitting control transistor T22 in the active semiconductor layer 310 through at least one hole (for example, a hole h3) in the gate insulating layer, the first insulating layer, and the second insulating layer; the second power line VDD2 is connected to the second connection electrode block VDDe2 in the second functional layer 530 through at least one hole (for example, a hole h6) in the second insulating layer.

For example, as shown in FIGS. 5D, 6D, and 5E, the first functional layer 540 further includes a first connection portion 541, a second connection portion 542, a third connection portion 543, and a fourth connection portion 544.

One end of the first connection portion 541 is connected to the drain region of the corresponding threshold compensation transistor T5 in the active semiconductor layer 510 through at least one hole (for example, a hole h7) in the gate insulating layer, the first insulating layer, and the second insulating layer, and the other end of the first connection portion 541 is connected to the gate electrode of the first driving transistor T11 (i.e., the first electrode CC1 of the storage capacitor C) in the third functional layer 520 through at least one hole (for example, a hole h8) in the first insulating layer and the second insulating layer.

One end of the second connection portion 542 is connected to the first initialization voltage line Vinit1 through a hole (for example, a hole h9) in the second insulating layer, and the other end of the second connection portion 542 is connected to the drain region of the first initialization transistor T6 in the active semiconductor layer 510 through at least one hole (for example, a hole h10) in the gate insulating layer, the first insulating layer, and the second insulating layer.

For example, as shown in FIG. 5D and FIG. 6D, the first functional layer of the pixel circuit of the sub-pixel in the (n+1)-th row includes a connection portion 542', one end of the connection portion 542' is connected to the second initialization voltage line Vinit2 through a hole (for example, a hole h9') in the second insulating layer, and the other end of the connection portion 542' is connected to the drain region of the second initialization transistor T7 in the active semiconductor layer 510 through at least one hole (for example, a hole h10') in the gate insulating layer, the first insulating layer, and the second insulating layer, so that the first electrode of the second initialization transistor T7 is electrically connected to the second initialization voltage line Vinit2, and the second electrode of the second initialization transistor T7 is finally connected to the first electrode (i.e., an anode) of the light-emitting element.

It should be noted that because the second electrode of the fourth light-emitting control transistor T32 is also electrically connected to the first electrode of the light-emitting element, the second electrode of the second initialization transistor T7 is also electrically connected to the second electrode of the fourth light-emitting control transistor T32.

The third connection portion 543 is connected to the drain region of the second light-emitting control transistor T31 in the active semiconductor layer 510 through at least one hole (for example, a hole h11) in the gate insulating layer, the first insulating layer, and the second insulating layer.

The fourth connection portion 544 is connected to the drain region of the fourth light-emitting control transistor T32 in the active semiconductor layer 510 through at least one hole (for example, a hole h12) in the gate insulating layer, the first insulating layer, and the second insulating layer.

For example, the first gate connection line Gc1 and the first connection portion 541 are integrally provided. For example, an end of the first gate connection line Gc1 away from the first connection portion 541 is connected to the third gate connection line Gc3 in the second functional layer 530 through at least one hole (for example, a hole h13) in the second insulating layer.

For example, one end of the second gate connection line Gc2 is connected to the third gate connection line Gc3 in the second functional layer 530 through at least one hole (for example, a hole h14) in the second insulating layer, and the other end of the second gate connection line Gc2 is connected to the gate electrode of the second driving transistor T12 in the third functional layer 520 through at least one hole (for example, a hole h15) in the first insulating layer and the second insulating layer.

It should be noted that, as shown in FIGS. 5D and 6D, the region of the first functional layer 540 corresponding to the region Ad in the active semiconductor layer 510 has a fifth connection portion 545, one end of the fifth connection portion 545 is connected to the first initialization voltage line Vinit1 through a hole (for example, a hole h16) in the second insulating layer, and the other end of the fifth connection portion 545 is connected to the region Ad in the active semiconductor layer 510 through at least one hole (for example, a hole h17) in the gate insulating layer, the first insulating layer, and the second insulating layer. Similarly, the fifth connection portion 545 is also provided to ensure the etching uniformity of the first sub-region and the second sub-region in the pixel region, and is not used as a part of the pixel circuit 100.

For example, an intermediate layer (not shown) is formed on the first functional layer 540 to protect the above-mentioned first functional layer 540. The first electrode of the light-emitting element of each sub-pixel may be arranged on a side of the intermediate layer away from the base substrate.

It should be noted that the positional arrangement relationship among the first driving circuit, the second driving circuit, the first light-emitting control circuit, the second light-emitting control circuit, the third light-emitting control circuit, the fourth light-emitting control circuit, the data writing circuit, the storage circuit, the threshold compensation circuit, the first initialization circuit, and the second initialization circuit in each pixel circuit is not limited to the examples shown in FIGS. 5A to 5E. The positions of the first driving circuit, the second driving circuit, the first light-emitting control circuit, the second light-emitting control circuit, the third light-emitting control circuit, the fourth light-emitting control circuit, the data writing circuit, the storage circuit, the threshold compensation circuit, the first initialization circuit, and the second initialization circuit can be specifically set according to the actual application requirements.

Figure 7:
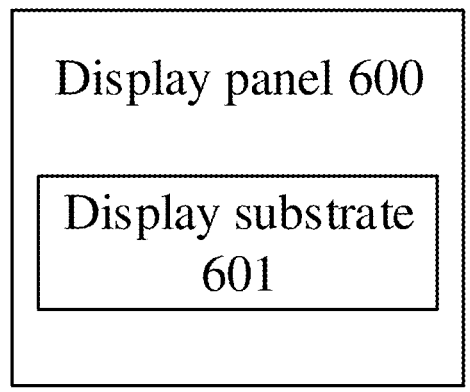
FIG. 7 is a schematic block diagram of a display panel provided by at least one embodiment of the present disclosure.

FIG. 7 is a schematic block diagram of a display panel provided by at least one embodiment of the present disclosure.

At least one embodiment of the present disclosure provides a display panel. For example, as shown in FIG. 7, the display panel 600 includes the display substrate 601 provided by any embodiment of the present disclosure.

For example, the display panel 600 may be an organic light-emitting diode (OLED) display panel or the like. For example, when the display panel 700 is an organic light-emitting diode display panel, the display substrate 601 may be an array substrate.

For example, the display panel 600 may be a rectangular panel, a circular panel, an oval panel, a polygonal panel, or the like. In addition, the display panel 600 can be not only a flat panel, but also a curved panel or even a spherical panel.

For example, the display panel 600 can also have a touch function, that is, the display panel 600 can be a touch display panel.

Figure 8:
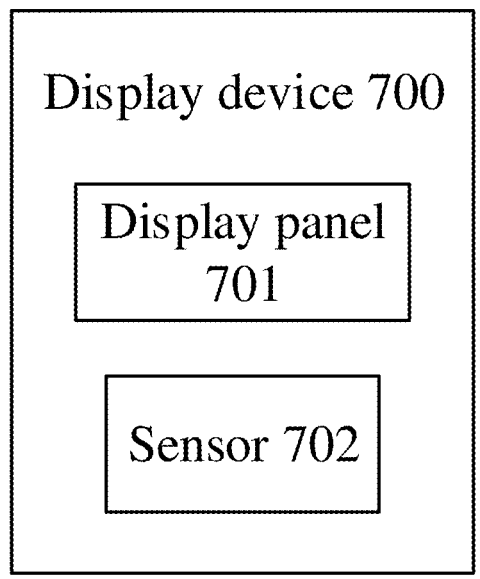
FIG. 8 is a schematic block diagram of a display device provided by at least one embodiment of the present disclosure.

For example, the display panel 600 can be applied to any products or components with a display function such as a mobile phone, a tablet computer, a television, a monitor, a notebook computer, a digital photo frame, a navigator, etc., FIG. 8 is a schematic block diagram of a display device provided by at least one embodiment of the present disclosure.

At least one embodiment of the present disclosure provides a display device. As shown in FIG. 8, the display device 700 includes a display panel 701 and a sensor 702. The display panel 701 is the display panel provided in any embodiment of the present disclosure, such as the aforementioned display panel 600. The sensor 702 is disposed on the second side (the non-display side) of the display substrate of the display panel, and is configured to receive light from the first side (the display side) of the display substrate. For example, the sensor 702 can be any type of sensor, such as a camera, an infrared sensor, etc.

For example, in some embodiments, the sensor 702 at least partially overlaps with the first display region 10 of the display substrate in the direction perpendicular to the panel surface of the display substrate, so that the sensor 702 can sufficiently receive the light from the first side of the display substrate and work based on the light.

For example, the display device 700 can be any electronic device with a display function, such as a smart phone, a notebook computer, a tablet computer, a TV, etc., For example, when the display device 700 is a smart phone or a tablet computer, the smart phone or tablet computer may have a full screen design, that is, does not have a peripheral region around the third display region 30. Moreover, the smart phone or tablet computer also has under-screen sensors (such as cameras, infrared sensors, etc.), which can be used for image shooting, distance detection, light intensity detection, and other operations.

For example, the display device can be any product or component with a display function, such as an electronic paper, a mobile phone, a tablet computer, a TV, a monitor, a notebook computer, a digital photo frame, a navigator, etc., and the embodiments of the present disclosure do not limit this.

It should be noted that other components (such as a control device, an image data encoding/decoding device, a gate driver, a timing controller, a clock circuit, etc.) of the display panel 701 and the display device 700 should be understood by those of ordinary skill in the field, and will not be described in detail here, nor should they be taken as limitations of the present disclosure.

For the present disclosure, the following statements should be noted:

(1) The accompanying drawings of the embodiment(s) of the present disclosure involve only the structure(s) related to the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should be understood that, in the case in which a component or element such as a layer, film, region, substrate or the like is referred to be "on" or "under" another component or element, the component or element may be "directly" "on" or "under" the another component or element or a component or element is interposed therebetween.

(3) In case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto, and the protection scope of the present disclosure should be based on the protection scope of the claims.

What is claimed is:

1. A display substrate, comprising a base substrate and a plurality of sub-pixels arranged on the base substrate,
    wherein each of the plurality of sub-pixels comprises a pixel circuit and a light-emitting element,
    the pixel circuit comprises: a first driving circuit, a second driving circuit, a first light-emitting control circuit, a second light-emitting control circuit, a storage circuit, and a data writing circuit,
    the first light-emitting control circuit is electrically connected to a first power line, the first driving circuit, and the light-emitting element, and is configured to control a connection between the first driving circuit and the light-emitting element to be turned on or off and to control a connection between the first driving circuit and the first power line to be turned on or off;
    the second light-emitting control circuit is electrically connected to a second power line, the second driving circuit, and the light-emitting element, and is configured to control a connection between the second driving circuit and the light-emitting element to be turned on or off and to control a connection between the second driving circuit and the second power line to be turned on or off;
    the data writing circuit is electrically connected to the first driving circuit, and is configured to write a data voltage into the first driving circuit;
    the first driving circuit and the second driving circuit are configured to control a driving current for driving the light-emitting element to emit light based on a same data voltage; and
    the storage circuit is electrically connected to a control terminal of the first driving circuit and a control terminal of the second driving circuit, and is configured to maintain a voltage of the control terminal of the first driving circuit and a voltage of the control terminal of the second driving circuit;
    the base substrate comprises a first display region and a second display region, the second display region at least partially surrounds the first display region, the display substrate has a first side for display and a second side opposite to the first side, and the first display region allows light from the first side to be at least partially transmitted to the second side;
    the plurality of sub-pixels comprise a plurality of first sub-pixels and a plurality of second sub-pixels;
    light-emitting elements of the plurality of first sub-pixels are in the first display region, and pixel circuits of the plurality of first sub-pixels are in the second display region;
    light-emitting elements and pixel circuits of the plurality of second sub-pixels are in the second display region; and
    the display substrate further comprises a plurality of data lines connected with pixel circuits of the plurality of first sub-pixels, and each of the plurality of data lines connected with the pixel circuits of the plurality of first sub-pixels at least partially passes through the first display region and then extends to the second display region.

2. The display substrate according to claim 1, wherein the display substrate further comprises a plurality of data lines connected with pixel circuits of the plurality of second sub-pixels, and each of the plurality of data lines connected with the pixel circuits of the plurality of second sub-pixels extends in the second display region.

3. The display substrate according to claim 1, wherein a pixel circuit of a first sub-pixel of the plurality of first sub-pixels is connected to a light-emitting element of the first sub-pixel through a connection line, and the connection line extends from the pixel circuit of the first sub-pixel in the second display region to the light-emitting element of the first sub-pixel in the first display region.

4. The display substrate according to claim 1, wherein the pixel circuit further comprises a power connection line,
wherein the first power line and the second power line are electrically connected to each other through the power connection line.

5. The display substrate according to claim 4, wherein the pixel circuit has a first functional layer and a second functional layer, the first functional layer and the second functional layer are on the base substrate, and the first functional layer is on a side of the second functional layer away from the base substrate in a direction perpendicular to the base substrate;
the first power line and the second power line are in the first functional layer;
the power connection line is in the second functional layer; and
the power connection line is electrically connected to the first power line and the second power line through holes.

6. The display substrate according to claim 1, wherein the control terminal of the first driving circuit and the control terminal of the second driving circuit are electrically connected,
the pixel circuit further comprises a first gate connection line, a second gate connection line, and a third gate connection line;
the control terminal of the first driving circuit and the control terminal of the second driving circuit are electrically connected through the first gate connection line, the second gate connection line, and the third gate connection line;
the control terminal of the first driving circuit is electrically connected to the first gate connection line, and the control terminal of the second driving circuit is electrically connected to the second gate connection line; and
the third gate connection line is used to electrically connect the first gate connection line and the second gate connection line to electrically connect the control terminal of the first driving circuit to the control terminal of the second driving circuit.

7. The display substrate according to claim 6, wherein the pixel circuit has a first functional layer and a second functional layer, the first functional layer and the second functional layer are on the base substrate, and the first functional layer is on a side of the second functional layer away from the base substrate in a direction perpendicular to the base substrate;
the first gate connection line and the second gate connection line are in the first functional layer;
the third gate connection line is in the second functional layer; and
the third gate connection line is connected to the first gate connection line and the second gate connection line through holes.

8. The display substrate according to claim 6, wherein the first driving circuit comprises a first driving transistor, and the second driving circuit comprises a second driving transistor,
the control terminal of the first driving circuit comprises a gate electrode of the first driving transistor, the control terminal of the second driving circuit comprises a gate electrode of the second driving transistor,
a threshold voltage of the first driving transistor is identical to a threshold voltage of the second driving transistor.

9. The display substrate according to claim 1, wherein the pixel circuit further comprises a threshold compensation circuit,
the threshold compensation circuit is electrically connected to the control terminal of the first driving circuit and the control terminal of the second driving circuit, and is configured to perform threshold compensation on the first driving circuit.

10. The display substrate according to claim 1, wherein the pixel circuit further comprises a first initialization circuit and a second initialization circuit,
the first initialization circuit is electrically connected to the control terminal of the first driving circuit and the control terminal of the second driving circuit, and is configured to initialize the control terminal of the first driving circuit and the control terminal of the second driving circuit; and
the second initialization circuit is electrically connected to a first electrode of the light-emitting element and is configured to initialize the first electrode of the light-emitting element.

11. The display substrate according to claim 1, wherein the first light-emitting control circuit comprises a first light-emitting control sub-circuit and a second light-emitting control sub-circuit;
the first light-emitting control sub-circuit is connected to a first terminal of the first driving circuit and the first power line, and is configured to turn on or off a connection between the first terminal of the first driving circuit and the first power line; and
the second light-emitting control sub-circuit is electrically connected to a second terminal of the first driving circuit and a first electrode of the light-emitting element, and is configured to turn on or off a connection between the second terminal of the first driving circuit and the first electrode of the light-emitting element;
wherein the second light-emitting control circuit comprises a third light-emitting control sub-circuit and a fourth light-emitting control sub-circuit,
the third light-emitting control sub-circuit is connected to a first terminal of the second driving circuit and the second power line, and is configured to turn on or off a connection between the first terminal of the second driving circuit and the second power line,
the fourth light-emitting control sub-circuit is electrically connected to a second terminal of the second driving circuit and a first electrode of the light-emitting element, and is configured to turn on or off a connection between the second terminal of the second driving circuit and the first electrode of the light-emitting element.

12. The display substrate according to claim 1, wherein the pixel circuit further comprises a threshold compensation circuit, a first initialization circuit, and a second initialization circuit, the first light-emitting control circuit comprises a first light-emitting control sub-circuit and a second light-emitting control sub-circuit, and the second light-emitting control circuit comprises a third light-emitting control sub-circuit and a fourth light-emitting control sub-circuit;

the first driving circuit comprises a first driving transistor, the second driving circuit comprises a second driving transistor, the first light-emitting control sub-circuit comprises a first light-emitting control transistor, the second light-emitting control sub-circuit comprises a second light-emitting control transistor, the third light-emitting control sub-circuit comprises a third light-emitting control transistor, the fourth light-emitting control sub-circuit comprises a fourth light-emitting control transistor, the data writing circuit comprises a data writing transistor, the storage circuit comprises a storage capacitor, the threshold compensation circuit comprises a threshold compensation transistor, the first initialization circuit comprises a first initialization transistor, and the second initialization circuit comprises a second initialization transistor;

the control terminal of the first driving circuit comprises a gate electrode of the first driving transistor, the control terminal of the second driving circuit comprises a gate electrode of the second driving transistor;

a first electrode of the data writing transistor is electrically connected to a data line to receive the data voltage, a second electrode of the data writing transistor is electrically connected to a first electrode of the first driving transistor, and a gate electrode of the data writing transistor is electrically connected to a first scan line;

a first electrode of the first light-emitting control transistor is electrically connected to the first power line, a second electrode of the first light-emitting control transistor is electrically connected to the first electrode of the first driving transistor, and a gate electrode of the first light-emitting control transistor is electrically connected to a first light-emitting control signal line;

a first electrode of the second light-emitting control transistor is electrically connected to a second electrode of the first driving transistor, a second electrode of the second light-emitting control transistor is electrically connected to a first electrode of the light-emitting element, and a gate electrode of the second light-emitting control transistor is electrically connected to a second light-emitting control signal line;

a first electrode of the third light-emitting control transistor is electrically connected to the second power line, a second electrode of the third light-emitting control transistor is electrically connected to a first electrode of the second driving transistor, and a gate electrode of the third light-emitting control transistor is electrically connected to a third light-emitting control signal line;

a first electrode of the fourth light-emitting control transistor is electrically connected to a second electrode of the second driving transistor, a second electrode of the fourth light-emitting control transistor is electrically connected to the first electrode of the light-emitting element, and a gate electrode of the fourth light-emitting control transistor is electrically connected to a fourth light-emitting control signal line;

a first electrode of the threshold compensation transistor is electrically connected to the second electrode of the first driving transistor, a second electrode of the threshold compensation transistor is electrically connected to the gate electrode of the first driving transistor and the gate electrode of the second driving transistor, and a gate electrode of the threshold compensation transistor is electrically connected to a second scan line;

a first electrode of the first initialization transistor is electrically connected to a first initialization voltage line, a second electrode of the first initialization transistor is electrically connected to the gate electrode of the first driving transistor and the gate electrode of the second driving transistor, and a gate electrode of the first initialization transistor is electrically connected to a first initialization control signal line;

a first electrode of the second initialization transistor is electrically connected to a second initialization voltage line, a second electrode of the second initialization transistor is electrically connected to the first electrode of the light-emitting element, and a gate electrode of the second initialization transistor is electrically connected to a second initialization control signal line; and a first electrode of the storage capacitor is electrically connected to the gate electrode of the first driving transistor and the gate electrode of the second driving transistor, and a second electrode of the storage capacitor is electrically connected to the first power line.

13. The display substrate according to claim 12, wherein the pixel circuit has a first functional layer, a second functional layer, and a third functional layer, the first functional layer, the second functional layer, and the third functional layer are on the base substrate, and in a direction perpendicular to the base substrate, the second functional layer is between the first functional layer and the third functional layer, the second functional layer is on a side of the third functional layer away from the base substrate, the first functional layer is on a side of the second functional layer away from the base substrate, the first scan line, the second scan line, the first light-emitting control signal line, the second light-emitting control signal line, the third light-emitting control signal line, and the fourth light-emitting control signal line are in the third functional layer;

the data line, the first power line, and the second power line are in the first functional layer; and the first initialization voltage line and the second initialization voltage line are in the second functional layer.

14. The display substrate according to claim 12, wherein the first driving transistor and the second driving transistor transmit the driving current to the light-emitting element to drive the light-emitting element to emit light in a light-emitting phase, the driving current is expressed as:

$$I_{OLED} = K1*(Vgs1 - Vth1) + K2*(Vgs2 - Vth2),$$

where $I_{OLED}$ represents the driving current, K1 is a process constant of the first driving transistor, Vgs1 is a voltage difference between the gate electrode and the first electrode of the first driving transistor in the light-emitting phase, Vth1 is a threshold voltage of the first driving transistor, K2 is a process constant of the second driving transistor, Vgs2 is a voltage difference between the gate electrode and the first electrode of the second driving transistor in the light-emitting stage, and Vth2 is a threshold voltage of the second driving transistor.

15. The display substrate according to claim 1,
wherein the first display region comprises a plurality of pixel regions,
each pixel region of the plurality of pixel regions comprises a first sub-region and a second sub-region that do not overlap each other,
the first driving circuit, the first light-emitting control circuit, the storage circuit, and the data writing circuit in the pixel circuit are in a first sub-region of a corresponding pixel region,
the second driving circuit and the second light-emitting control circuit in the pixel circuit are in a second sub-region of the corresponding pixel region;
the pixel circuits of the plurality of first sub-pixels and the pixel circuits of the plurality of second sub-pixels are in one-to-one correspondence with the plurality of pixel regions.

16. The display substrate according to claim 15, wherein the first sub-region of each pixel region comprises a first side and a second side opposite to each other,
the pixel circuits of the plurality of first sub-pixels constitute a plurality of first repeating units, each first repeating unit comprises pixel circuits of four first sub-pixels arranged in two rows and two columns,
a second sub-region in a pixel region corresponding to a pixel circuit, among the pixel circuits of the four first sub-pixels, of a first sub-pixel located in a first row and a first column is on a first side of a first sub-region in the pixel region corresponding to the pixel circuit of the first sub-pixel located in the first row and the first column,
a second sub-region in a pixel region corresponding to a pixel circuit, among the pixel circuits of the four first sub-pixels, of a first sub-pixel located in a second row and the first column is on a first side of a first sub-region in the pixel region corresponding to the pixel circuit of the first sub-pixel located in the second row and the first column,
a second sub-region in a pixel region corresponding to a pixel circuit, among the pixel circuits of the four first sub-pixels, of a first sub-pixel located in the first row and a second column is on a second side of a first sub-region in the pixel region corresponding to the pixel circuit of the first sub-pixel located in the first row and the second column,
a second sub-region in a pixel region corresponding to a pixel circuit, among the pixel circuits of the four first sub-pixels, of a first sub-pixel located in the second row and the second column is on a second side of a first sub-region in the pixel region corresponding to the pixel circuit of the first sub-pixel located in the second row and the second column,
the pixel circuits of the plurality of second sub-pixels constitute a plurality of second repeating units, each second repeating unit comprises pixel circuits of four second sub-pixels arranged in two rows and two columns,
a second sub-region in a pixel region corresponding to a pixel circuit, among the pixel circuits of the four second sub-pixels, of a second sub-pixel located in a first row and a first column is on a second side of a first sub-region in the pixel region corresponding to the pixel circuit of the second sub-pixel located in the first row and the first column,
a second sub-region in a pixel region corresponding to a pixel circuit, among the pixel circuits of the four second sub-pixels, of a second sub-pixel located in a second row and the first column is on a second side of a first sub-region in the pixel region corresponding to the pixel circuit of the second sub-pixel located in the second row and the first column,
a second sub-region in a pixel region corresponding to a pixel circuit, among the pixel circuits of the four second sub-pixels, of a second sub-pixel located in the first row and a second column is on a first side of a first sub-region in the pixel region corresponding to the pixel circuit of the second sub-pixel located in the first row and the second column,
a second sub-region in a pixel region corresponding to a pixel circuit, among the pixel circuits of the four second sub-pixels, of a second sub-pixel located in the second row and the second column is on a first side of a first sub-region in the pixel region corresponding to the pixel circuit of the second sub-pixel located in the second row and the second column.

17. The display substrate according to claim 16, wherein the plurality of first repeating units and the plurality of second repeating units constitute a plurality of repeating unit groups, and each repeating unit group in the plurality of repeating unit groups comprises two first repeating units and two second repeating units,
the two first repeating units and the two second repeating units are arranged in two rows and two columns,
the two first repeating units are respectively in a first row and a second column, and a second row and a first column, and the two second repeating units are respectively in the first row and the first column, and the second row and the second column; or, the two first repeating units are respectively in a first row and a first column, and a second row and a second column, and the two second repeating units are respectively in the first row and the second column, and the second row and the first column.

18. The display substrate according to claim 16, wherein the first sub-pixel located in the first row and the first column among the four first sub-pixels and the second sub-pixel located in the first row and the first column among the four second sub-pixels are red sub-pixels,
the first sub-pixel located in the second row and the first column among the four first sub-pixels and the second sub-pixel located in the second row and the first column among the four second sub-pixels are blue sub-pixels,
the first sub-pixel located in the first row and the second column among the four first sub-pixels, the first sub-pixel located in the second row and the second column among the four first sub-pixels, the second sub-pixel located in the first row and the second column among the four second sub-pixels, and the second sub-pixel located in the second row and the second column among the four second sub-pixels are green sub-pixels.

19. A display panel, comprising a display substrate,
wherein the display substrate comprises a base substrate and a plurality of sub-pixels arranged on the base substrate,
each of the plurality of sub-pixels comprises a pixel circuit and a light-emitting element,
the pixel circuit comprises: a first driving circuit, a second driving circuit, a first light-emitting control circuit, a second light-emitting control circuit, a storage circuit, and a data writing circuit, the first light-emitting control circuit is electrically connected to a first power line, the first driving circuit, and the light-emitting element, and is configured to control a connection between the first driving circuit and the light-emitting element to be turned on or off and to control a connection between the first driving circuit and the first power line to be turned on or off;

the second light-emitting control circuit is electrically connected to a second power line, the second driving circuit, and the light-emitting element, and is configured to control a connection between the second driving circuit and the light-emitting element to be turned on or off and to control a connection between the second driving circuit and the second power line to be turned on or off;

the data writing circuit is electrically connected to the first driving circuit, and is configured to write a data voltage into the first driving circuit;

the first driving circuit and the second driving circuit are configured to control a driving current for driving the light-emitting element to emit light based on a same data voltage; and the storage circuit is electrically connected to a control terminal of the first driving circuit and a control terminal of the second driving circuit, and is configured to maintain a voltage of the control terminal of the first driving circuit and a voltage of the control terminal of the second driving circuit;

the base substrate comprises a first display region and a second display region, the second display region at least partially surrounds the first display region, the display substrate has a first side for display and a second side opposite to the first side, and the first display region allows light from the first side to be at least partially transmitted to the second side;

the plurality of sub-pixels comprise a plurality of first sub-pixels and a plurality of second sub-pixels;

light-emitting elements of the plurality of first sub-pixels are in the first display region, and pixel circuits of the plurality of first sub-pixels are in the second display region;

light-emitting elements and pixel circuits of the plurality of second sub-pixels are in the second display region; and the display substrate further comprises a plurality of data lines connected with the plurality of first sub-pixels, and each of the plurality of data lines connected with the plurality of first sub-pixels at least partially passes through the first display region and then extends to the second display region.

20. A display device, comprising a display panel, wherein the display panel comprises a display substrate, and the display substrate comprises a base substrate and a plurality of sub-pixels arranged on the base substrate, each of the plurality of sub-pixels comprises a pixel circuit and a light-emitting element, the pixel circuit comprises: a first driving circuit, a second driving circuit, a first light-emitting control circuit, a second light-emitting control circuit, a storage circuit, and a data writing circuit, the first light-emitting control circuit is electrically connected to a first power line, the first driving circuit, and the light-emitting element, and is configured to control a connection between the first driving circuit and the light-emitting element to be turned on or off and to control a connection between the first driving circuit and the first power line to be turned on or off;

the second light-emitting control circuit is electrically connected to a second power line, the second driving circuit, and the light-emitting element, and is configured to control a connection between the second driving circuit and the light-emitting element to be turned on or off and to control a connection between the second driving circuit and the second power line to be turned on or off;

the data writing circuit is electrically connected to the first driving circuit, and is configured to write a data voltage into the first driving circuit;

the first driving circuit and the second driving circuit are configured to control a driving current for driving the light-emitting element to emit light based on a same data voltage; and the storage circuit is electrically connected to a control terminal of the first driving circuit and a control terminal of the second driving circuit, and is configured to maintain a voltage of the control terminal of the first driving circuit and a voltage of the control terminal of the second driving circuit;

the base substrate comprises a first display region and a second display region, the second display region at least partially surrounds the first display region, the display substrate has a first side for display and a second side opposite to the first side, and the first display region allows light from the first side to be at least partially transmitted to the second side;

the plurality of sub-pixels comprise a plurality of first sub-pixels and a plurality of second sub-pixels;

light-emitting elements of the plurality of first sub-pixels are in the first display region, and pixel circuits of the plurality of first sub-pixels are in the second display region;

light-emitting elements and pixel circuits of the plurality of second sub-pixels are in the second display region; and the display substrate further comprises a plurality of data lines connected with the plurality of first sub-pixels, and each of the plurality of data lines connected with the plurality of first sub-pixels at least partially passes through the first display region and then extends to the second display region.

\* \* \* \* \*